(12) United States Patent
Yasuda et al.

(10) Patent No.: US 9,300,310 B2
(45) Date of Patent: Mar. 29, 2016

(54) SELECTION DEVICE

(75) Inventors: Akira Yasuda, Nishitokyo (JP); Jun-ichi Okamura, Kawasaki (JP)

(73) Assignee: TRIGENCE SEMICONDUCTOR, INC., Tokyo (JP)

(*) Notice: Subject to any disclaimer, the term of this patent is extended or adjusted under 35 U.S.C. 154(b) by 496 days.

(21) Appl. No.: 13/221,335

(22) Filed: Aug. 30, 2011

(65) Prior Publication Data
US 2012/0057727 A1    Mar. 8, 2012

Related U.S. Application Data

(63) Continuation of application No. PCT/JP2010/059211, filed on May 31, 2010.

(30) Foreign Application Priority Data

Dec. 9, 2009 (JP) ................. 2009-279805

(51) Int. Cl.
*H02B 1/00* (2006.01)
*H03M 1/66* (2006.01)
*H04R 3/00* (2006.01)
*H03M 1/06* (2006.01)
(Continued)

(52) U.S. Cl.
CPC ............. *H03M 1/066* (2013.01); *H03M 1/74* (2013.01); *H03M 3/502* (2013.01)

(58) Field of Classification Search
CPC ....... H03M 1/066; H03M 1/74; H03M 3/502; H04R 5/04; H04R 19/02
USPC ............ 381/111, 116, 117, 81, 85, 123, 120; 341/144, 118, 120, 153
See application file for complete search history.

(56) References Cited

U.S. PATENT DOCUMENTS

| 4,555,797 A | 11/1985 | Nieuwendijk et al. |
| 4,566,120 A | 1/1986 | Neieuwendijk et al. |
| 5,347,587 A | 9/1994 | Takahashi et al. |

(Continued)

FOREIGN PATENT DOCUMENTS

| CN | 1204895 A | 1/1999 |
| CN | 1615588 A | 5/2005 |

(Continued)

OTHER PUBLICATIONS

Japanese Office Action mailed Aug. 20, 2013 in corresponding Japanese Application No. 2008-314438.

(Continued)

*Primary Examiner* — Vivian Chin
*Assistant Examiner* — William A. Jerez Lora
(74) *Attorney, Agent, or Firm* — Typha IP LLC

(57) ABSTRACT

A selection device includes an acquisition part to acquire digital selection signals, and an output part to output selection signals to respective unit cells, each unit cell capable of being commanded to output the value zero. In the selection device, each selection signal is to command the unit cell to output a value corresponding to that selection signal; the sum of the values to be output as commanded by the respective selection signals, which are output to the respective unit cells, is a value determined in association with the digital selection signal; and if the output corresponding to the digital selection signal is the value zero, then selection signals each commanding to output a non-zero value (N) are output to some of the unit cells.

11 Claims, 21 Drawing Sheets

(51) Int. Cl.
    *H03M 1/74* (2006.01)
    *H03M 3/00* (2006.01)

(56) References Cited

U.S. PATENT DOCUMENTS

| | | | |
|---|---|---|---|
| 5,404,142 A | 4/1995 | Adams et al. | |
| 5,530,750 A | 6/1996 | Akagiri | |
| 5,592,559 A | 1/1997 | Takahashi et al. | |
| 5,856,799 A | 1/1999 | Hamasaki et al. | |
| 5,862,237 A | 1/1999 | Kishigami et al. | |
| 5,872,532 A * | 2/1999 | Yasuda | 341/143 |
| 5,909,496 A * | 6/1999 | Kishigami et al. | 381/111 |
| 5,982,317 A | 11/1999 | Steensgaard-Madsen | |
| 6,075,473 A | 6/2000 | Masuda | |
| 6,160,894 A | 12/2000 | Kishigami et al. | |
| 6,281,824 B1 | 8/2001 | Masuda | |
| 6,292,124 B1 | 9/2001 | Hanada et al. | |
| 6,362,765 B2 | 3/2002 | Masuda | |
| 6,388,598 B2 | 5/2002 | Masuda | |
| 6,426,715 B1 | 7/2002 | Westra et al. | |
| 6,476,752 B1 | 11/2002 | Eastty et al. | |
| 6,563,448 B1 | 5/2003 | Fontaine | |
| 6,694,028 B1 | 2/2004 | Matsuo | |
| 6,697,004 B1 | 2/2004 | Galton et al. | |
| 6,807,281 B1 | 10/2004 | Sasaki et al. | |
| 6,930,625 B1 | 8/2005 | Lin | |
| 6,940,436 B2 | 9/2005 | Hezar et al. | |
| 7,058,463 B1 | 6/2006 | Ruha et al. | |
| 7,081,793 B2 | 7/2006 | Morris et al. | |
| 7,089,069 B2 | 8/2006 | Gabriel et al. | |
| 7,091,893 B2 | 8/2006 | Seknicka | |
| 7,098,828 B2 | 8/2006 | San et al. | |
| 7,336,794 B2 | 2/2008 | Fürst et al. | |
| 7,439,440 B2 | 10/2008 | Hsu | |
| 7,492,297 B2 | 2/2009 | Lin | |
| 7,696,816 B2 | 4/2010 | Bates | |
| 7,710,300 B2 | 5/2010 | Kwan | |
| 7,792,311 B1 | 9/2010 | Holmgren et al. | |
| 7,825,986 B2 | 11/2010 | Chung | |
| 7,889,109 B2 | 2/2011 | Murahashi | |
| 8,098,718 B2 | 1/2012 | Sienko et al. | |
| 8,306,244 B2 | 11/2012 | Okamura et al. | |
| 8,423,165 B2 | 4/2013 | Yasuda et al. | |
| 8,577,483 B2 | 11/2013 | Oh et al. | |
| 8,620,005 B2 | 12/2013 | Ma et al. | |
| 2001/0022556 A1 | 9/2001 | Masuda | |
| 2001/0052868 A1 | 12/2001 | Masuda | |
| 2002/0084925 A1 | 7/2002 | Dedic et al. | |
| 2003/0018790 A1 | 1/2003 | Nonaka | |
| 2003/0122692 A1 | 7/2003 | Roeckner et al. | |
| 2003/0123678 A1 | 7/2003 | Kemmerer et al. | |
| 2003/0123681 A1 | 7/2003 | Furst et al. | |
| 2003/0156051 A1 | 8/2003 | Brooks et al. | |
| 2003/0179891 A1 | 9/2003 | Rabinowitz et al. | |
| 2004/0008859 A1 | 1/2004 | Zhao | |
| 2004/0032355 A1 | 2/2004 | Melanson | |
| 2004/0124915 A1 | 7/2004 | Heubi et al. | |
| 2005/0012545 A1 | 1/2005 | Mallinson | |
| 2005/0031151 A1 | 2/2005 | Melillo | |
| 2005/0075744 A1 | 4/2005 | Reefman et al. | |
| 2005/0089182 A1 | 4/2005 | Troughton et al. | |
| 2005/0168365 A1 | 8/2005 | Kaplan | |
| 2005/0264586 A1 | 12/2005 | Kim | |
| 2006/0007027 A1 | 1/2006 | Ishizuka et al. | |
| 2006/0013413 A1 | 1/2006 | Sakaidani | |
| 2006/0049889 A1 | 3/2006 | Hooley | |
| 2006/0149401 A1 | 7/2006 | Chung | |
| 2006/0149402 A1 | 7/2006 | Chung | |
| 2006/0176203 A1 | 8/2006 | Grosso et al. | |
| 2006/0192703 A1 | 8/2006 | Yen | |
| 2006/0290550 A1 | 12/2006 | Lee | |
| 2007/0121968 A1 | 5/2007 | Na | |
| 2008/0186218 A1 | 8/2008 | Ohkuri et al. | |
| 2008/0219474 A1 | 9/2008 | Deruginsky et al. | |
| 2009/0110217 A1 | 4/2009 | Yasuda et al. | |
| 2009/0243905 A1 * | 10/2009 | Redmayne et al. | 341/144 |
| 2009/0296954 A1 | 12/2009 | Hooley et al. | |
| 2010/0008521 A1 | 1/2010 | Cohen et al. | |
| 2010/0245142 A1 * | 9/2010 | Myles et al. | 341/133 |
| 2011/0051954 A1 | 3/2011 | Thomsen et al. | |
| 2011/0150244 A1 | 6/2011 | Lin et al. | |
| 2012/0033837 A1 | 2/2012 | Mitsui et al. | |
| 2012/0099740 A1 | 4/2012 | Ma et al. | |
| 2013/0156231 A1 | 6/2013 | Yasuda et al. | |
| 2014/0029763 A1 | 1/2014 | Takada et al. | |

FOREIGN PATENT DOCUMENTS

| | | |
|---|---|---|
| CN | 1636420 | 7/2005 |
| CN | 1702710 A | 11/2005 |
| CN | 101242678 | 8/2008 |
| CN | 101542909 A | 9/2009 |
| CN | 101986721 A | 3/2011 |
| CN | 1972525 B | 12/2011 |
| CN | 101242678 B | 1/2012 |
| CN | 102422650 A | 4/2012 |
| CN | 101257729 B | 3/2013 |
| CN | 103167380 A | 6/2013 |
| EP | 0 712 549 B1 | 11/2000 |
| JP | S56-048698 A | 5/1981 |
| JP | 57-3498 | 1/1982 |
| JP | 57-138293 | 8/1982 |
| JP | 58-127795 | 8/1983 |
| JP | 2-121497 | 5/1990 |
| JP | H03-066297 A | 3/1991 |
| JP | 03-216025 | 9/1991 |
| JP | 4-355599 | 12/1992 |
| JP | 5-145988 | 6/1993 |
| JP | 5-176387 | 7/1993 |
| JP | H05-199575 A | 8/1993 |
| JP | 6-335082 | 12/1994 |
| JP | 7-131881 | 5/1995 |
| JP | 8-65791 | 3/1996 |
| JP | 8-154058 | 6/1996 |
| JP | 9-46787 | 2/1997 |
| JP | 9-501287 | 2/1997 |
| JP | 9-186601 | 7/1997 |
| JP | 10-13986 | 1/1998 |
| JP | H10-051888 A | 2/1998 |
| JP | 10-276093 | 10/1998 |
| JP | 10-276490 | 10/1998 |
| JP | 11-502981 | 3/1999 |
| JP | 11-112245 | 4/1999 |
| JP | 11-122110 | 4/1999 |
| JP | 11-262084 | 9/1999 |
| JP | 2000-78015 | 3/2000 |
| JP | 2000-228630 | 8/2000 |
| JP | 2000-295049 | 10/2000 |
| JP | 2000-341129 | 12/2000 |
| JP | 2001-36409 | 2/2001 |
| JP | 2002-504277 | 2/2002 |
| JP | 2002-216026 A | 8/2002 |
| JP | 2002-374170 | 12/2002 |
| JP | 2003-513502 | 4/2003 |
| JP | 2003-216163 | 7/2003 |
| JP | 2003-324788 | 11/2003 |
| JP | 2004-222251 A | 8/2004 |
| JP | 2005-338763 | 12/2005 |
| JP | 2006-19988 | 1/2006 |
| JP | 2006-067008 A | 3/2006 |
| JP | 2006-109275 | 4/2006 |
| JP | 2006-303618 | 11/2006 |
| JP | 2006-338763 | 12/2006 |
| JP | 2006-339852 A | 12/2006 |
| JP | 2008-67041 | 3/2008 |
| JP | 2008-193160 A | 8/2008 |
| JP | 2009-147928 | 7/2009 |
| JP | 2009-538553 | 11/2009 |
| JP | 2000-269761 | 9/2010 |
| JP | 2010-263332 | 11/2010 |
| JP | 2012-227589 | 11/2012 |
| JP | 2012-227598 | 11/2012 |
| JP | 2013-157972 | 8/2013 |
| JP | 2013-543715 | 12/2013 |

(56) References Cited

FOREIGN PATENT DOCUMENTS

| WO | WO 95/05034 | 2/1995 |
|---|---|---|
| WO | 96/31086 | 10/1996 |
| WO | 01/31793 | 5/2001 |
| WO | 03/071827 A2 | 8/2003 |
| WO | 2007/135928 | 11/2007 |
| WO | WO 2007/135928 A9 | 11/2007 |

OTHER PUBLICATIONS

Japanese Office Action mailed Aug. 20, 2013 in corresponding Japanese Application No. 2008-314929.
Japanese Office Action mailed Sep. 10, 2013 in corresponding Japanese Application No. 2011-510759.
Takesaburo Yanagisawa et al., "Piezo-Electric Type Digital Loudspeaker and Dynamic Responses as Digital-to-Analog Converter", Transactions of the Institute of Electronics, Information and Communication Engineers, vol. 72, No. 11, Nov. 1989, pp. 1724-1732.
Takesaburo Yanagisawa et al., "Possibility of Multi-Bits in Piezo-Electric Type Digital Loudspeaker with Compound Driving System", Transactions of the Institute of Electronics, Information and Communication Engineers, vol. 74, No. 6, Jun. 1991, pp. 913-915.
Takesaburo Yanagisawa et al., "Piezo-Electric Type Loudspeaker Driven by 16 bits Digital Signal and Its Acoustic Responses", Transactions of the Institute of Electronics, Information and Communication Engineers, vol. J76-A, No. 9, Sep. 1993, pp. 1392-1395.
Hajime Ueno et al., "Digital-driven piezoelectric speaker using multi-bit delta-sigma modulation", The 121st Convention of Audio Engineering Society, Oct. 2006, pp. 1- 6.
Kazushige Kuroki et al., "A Digitally Direct Driven Small Loud Speaker", The 13th Regional Convention of Audio Engineering Society, Jul. 2007, pp. 1-6.
Ryota Saito et al., "A Digitally Direct Driven Dynamic-type Loudspeaker", The 124th Convention of Audio Engineering Society, May 2008, pp. 1-8.
Ichiro Fujimori et al., "A Multibit Delta-Sigma Audio DAC with 120-dB Dynamic Range", IEEE Journal of Solid-State Circuits, Aug. 2000, pp. 1-9.
Masanori Shibata et al., "A Cascaded Delta-Sigma DAC with an analog FIR filter reducing mismatch-effects", IEEE, Aug. 2005, pp. 1-5.
Tsuyoshi Soga et al., "A direct digital driving speaker", Acoustical Society of Japan, Sep. 2005, pp. 1-6.
Pieter Rombouts et al., A Study of Dynamic Element-Matching Techniques for 3-level Unit Elements, IEEE Transaction On Circuits and Systems, vol. 47, No. 11, Nov. 2000, pp. 1177-1187.
Japanese Office Action mailed Nov. 9, 2010 issued in corresponding Japanese Patent Application No. 2008-516630.
Japanese Office Action mailed May 11, 2010 issued in corresponding Japanese Patent Application No. 2008-310147.
Japanese Office Action mailed Nov. 9, 2010 issued in corresponding Japanese Patent Application No. 2008-310147.
Japanese Office Action mailed Mar. 16, 2010 issued in corresponding Japanese Patent Application No. 2008-516630.
International Search Report mailed Jul. 6, 2010 issued in corresponding International Patent Application No. PCT/JP2010/059211.
U.S. Office Action mailed Jan. 9, 2013 in a possible related U.S. Appl. No. 12/979,070.
Extended European Search Report mailed Jul. 31, 2013 in corresponding European Application No. 10788219.3.
Extended European Search Report mailed Dec. 11, 2013 in corresponding European Application No. 10835733.6.
Chinese Office Action issued May 6, 2014 in corresponding Chinese Patent Application No. 201080029610.4.
Japanese Office Action issued Jul. 15, 2014 in corresponding Japanese Patent Application No. 2011-510758.
Japanese Office Action issued Jul. 15, 2015 in corresponding Japanese Patent Application No. 2013-229250.
Japanese Office Action issued Jan. 20, 2015 in corresponding Japanese Patent Application No. 2011-510758.
Chinese Office Action issued Jan. 8, 2015 in corresponding Chinese Patent Application No. 201210086644.8.
Chinese Office Action issued Dec. 3, 2014 in corresponding Chinese Patent Application No. 201210549780.6.
Partial Translation of JP 57-3498A which was previously cited in the IDS of Sep. 24, 2014.
Japanese Office Action issued Feb. 17, 2015 in corresponding Japanese Patent Application No. 2014-098585.
Japanese Office Action issued Feb. 3, 2015 in corresponding Japanese Patent Application No. 2014-115496.
Chinese Office Action issued Feb. 2, 2015 in corresponding Chinese Patent Application No. 201210086679.1.
Summons to attend oral proceedings issued Feb. 9, 2015 in corresponding European Patent Application No. 10788219.3.
Chinese Office Action issued Dec. 3, 2014 in corresponding Chinese Patent Application No. 201210087070.6.
Extended European Search Report issued Nov. 4, 2014 in corresponding European Patent Application No. 09766515.2.
Office Action issued by the United States Patent and Trademark Office on Sep. 24, 2014 in U.S. Appl. No. 12/929,070.
Chinese Office Action issued Nov. 15, 2014 in corresponding Chinese Patent Application No. 201080029610.4.
Office Action issued by the U.S. Patent and Trademark Office on Jul. 22, 2014 in U.S. Appl. No. 13/552,270.
Office Action issued by the European Patent Office on Jul. 22, 2014 in the corresponding European patent application No. 10 788 219.3.
Office Action issued by the Chinese Patent Office on Jun. 23, 2014 in the corresponding Chinese patent application No. 2010800019188.
US Office Action issued Apr. 1, 2015 in related U.S. Appl. No. 13/665,320.
Japanese Office Action issued Mar. 3, 2015 in corresponding Japanese Patent Application No. 2014-081167.
Chinese Office Action issued Mar. 9, 2015 in corresponding Chinese Patent Application No. 201080001918.8.
Korean Office Action issued Apr. 1, 2015 in corresponding Korean Patent Application No. 10-2010-7005223.
Japanese Notice of Allowance issued Apr. 14, 2015 in corresponding Japanese Patent Application No. 2014-115496.
Office Action issued Jun. 18, 2015 in related U.S. Appl. No. 13/763,083.
Notice of Allowance issued Jul. 23, 2015 in U.S. Appl. No. 13/665,320.
Office Action dated Aug. 26, 2015 regarding a corresponding Chinese Patent Application No. 201210549780.6.
Office Action dated Sep. 8, 2015 regarding a corresponding Japanese Patent Application No. 2014-185599.
Office Action dated Sep. 14, 2015 regarding a corresponding Chinese Patent Application No. 201280001918.8.
Notice of Reasons for Refusal dated Oct. 27, 2015 regarding a corresponding Japanese Patent Application No. 2014-211709.
Office Action mailed on Oct. 7, 2015, by USPTO regarding the U.S. Appl. No. 14/722,780.
Notice of Final Rejection mailed on Oct. 13, 2015, regarding Korean Patent Application No. 10-2010-67005223.

\* cited by examiner

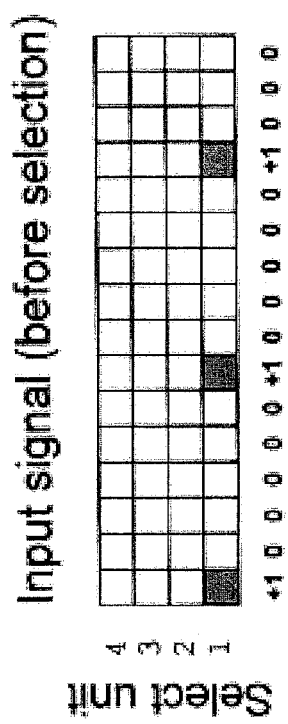
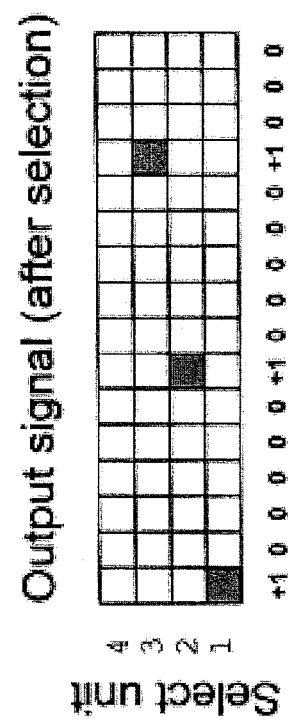
FIG. 2 (a)
FIG. 2 (b)

(a)

(b)

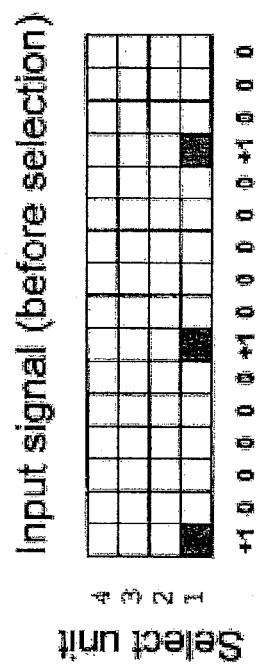
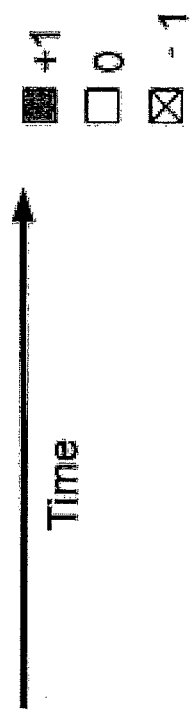
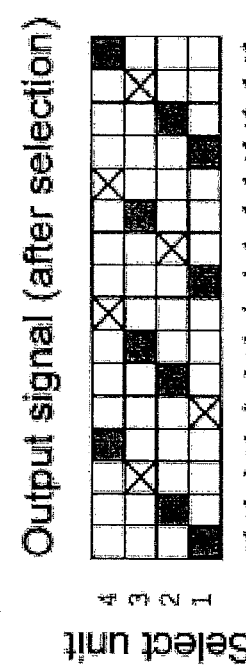
FIG. 10 (a)
FIG. 10 (b)

(a)

(b)

SELECTION DEVICE

CROSS-REFERENCE TO RELATED APPLICATIONS

This application is a U.S. continuation application filed under 35 USC 111(a) claiming benefit under 35 USC 120 and 365(c) of PCT application JP2010/059211, filed on May 31, 2010, which claims priority to Japanese Application No. 2009-279805 filed on Dec. 9, 2009, the entire contents of the foregoing application being incorporated herein by reference.

BACKGROUND

1. Field

The present invention is related to a selection device which selects outputs of a plurality of current sources or voltage sources in a digital/analog (D/A) converter. In particular, the present invention is related to a selection device used in a digital speaker system which converts a digital signal to analog audio using a plurality of coils (units) which are driven by a plurality of digital signals.

2. Description of the Related Art

Generally, when forming a D/A converter, n number of unit cells (U) are selected in order to obtain a current output from the D/A converter corresponding to a digital output signal. In this way, an output (Y) becomes Y=U×n and digital/analog conversion takes place. In the case where a unit cell is a current source (IU), the output current becomes Y=IU×n and in the case where a unit cell is a voltage source (VU), the output voltage becomes Y=VU×n.

However, generally an output value (current value or voltage value) of a current source or a voltage source which forms a unit cell has errors due to the effects of manufacturing variations. When each error held by the unit cell is $\epsilon_i$, the output Y can be expressed as the following formula.

$$Y = U \times n + \sum_{i=1}^{n} \epsilon_i \quad \text{[Formula 1]}$$

That is, there are errors in the formula which express the output Y. Differential linearity error (DNL) which is the indicator of the capability of a D/A converter becomes DNL=$\epsilon_i$ because of these errors. Therefore, there is a problem whereby the extent of unit cell manufacturing variation determines the conversion accuracy of the D/A converter.

In order to overcome this type of problem, a dynamic element matching method (referred to as error diffusion technology hereinafter) is proposed for selecting units independently from inputting. For example, the operating principles of an error diffusion circuit are described in the section 8.8.3 of "Delta-Sigma Data Converters" IEEE Press 1997 ISBN 0-7803-1045-4.

When there is an error in a unit cell, the error remains in an adder without being cancelled out when outputting 0 as a value (outputting a value 0). This error deteriorates the DNL as stated above. Therefore, a selection device which is inserted between the D/A converter and a unit cell is used in error diffusion technology. The errors can be smoothed by changing the selection method of the unit cell even if an input to the selection device is the same. Here, "selection" means outputting a signal, which instructs an output of a predetermined value, to the unit cell. In addition, when outputting an instruction signal so that a value 0 is output by a unit cell, that unit cell is said to be not selected. Also, when instructing an output of a value other than 0 to a unit cell according to a selection signal, this unit cell is sometimes called "selected unit cell."

A method for randomly changing a selection as an algorithm by which a selection device selects unit cells and a method by which a selection device selects in order the cells which are not to be selected are proposed. If an error can be smoothed faster than the necessary frequency (bandwidth) for a D/A converter using oversampling technology, it is possible to shift the error to a higher frequency region than a frequency region necessary for the output of the D/A converter.

In Japan Patent Laid Open H9-18660, a method is proposed whereby by inputting a signal which drives a plurality of unit cells to a selection device and controlling by the output from a circuit which integrates once or more the usage or the non usage of unit cells, the usage frequencies of unit cells are integrated and the selection device is controlled so that the integration results are maintained as a constant For example, the operation of error diffusion technology using a conventional selection device in a circuit which selects a unit cell using a three value selection signal (−1, 0, 1) is explained below. Furthermore, a selection signal is a signal which instructs a unit cell, which is output with the selection signal, to perform outputting. In addition, in the case of denoting "a selection signal (−1, 0, 1)" the unit cell is instructed by the selection signal to perform outputting a value either corresponding to −1 value which is a negative value, corresponding to a value 0, or corresponding to 1 value which is a positive value. Also, this is sometimes called a 3 value selection signal because an output is instructed which corresponds to either −1, 0 or 1. Furthermore, the unit cell does not operate and a signal which is sometimes not output is also included in the case where an output of a value 0 is instructed to a unit cell.

The operation of an error diffusion method which uses a 3 value selection signal (−1, 0, 1) is explained concisely using FIG. 1. A D/A converter which performs error diffusion is comprised of a digital signal X (301), a D/A converter (302), a plurality of digital selection signals Dn (303) from the D/A converter (302), a selection device (304), a selection signal Sn from the selection device (304), a plurality of unit cells (306), a plurality of outputs Ym (307) from the unit cell and an adder (308) which adds Ym. The digital selection signals Dn expresses the result of totaling the values of outputs of the unit cells (306) by the adder (308).

Table 1 shows a truth table (left side of table 1) of a selection signal Dn (303) from the D/A converter (302) and a truth table (right side of table 1) of output signals Ym (307) of unit cells are shown in table 1. The output of the D/A converter is a 2 value thermometer code and is weighted as below so that it corresponds to a 3 value selection signal by using two bits of the 2 value thermometer code in the unit cell.

TABLE 1

| Truth table of D/A output signal (Dn) | | | | | | | | |
|---|---|---|---|---|---|---|---|---|
| X | D0 | D1 | D2 | D3 | D4 | D5 | D6 | D7 |
| +4 | 0 | 0 | 0 | 0 | 1 | 1 | 1 | 1 |
| +3 | 0 | 0 | 0 | 0 | 1 | 1 | 1 | 0 |
| +2 | 0 | 0 | 0 | 0 | 1 | 1 | 0 | 0 |
| +1 | 0 | 0 | 0 | 0 | 1 | 0 | 0 | 0 |
| 0 | 0 | 0 | 0 | 0 | 0 | 0 | 0 | 0 |
| −1 | 0 | 0 | 0 | 1 | 0 | 0 | 0 | 0 |
| −2 | 0 | 0 | 1 | 1 | 0 | 0 | 0 | 0 |
| −3 | 0 | 1 | 1 | 1 | 0 | 0 | 0 | 0 |
| −4 | 1 | 1 | 1 | 1 | 0 | 0 | 0 | 0 |

TABLE 1-continued

Truth table of cell selection(Ym)

| Y0 | Y1 | Y2 | Y3 | Y |
|---|---|---|---|---|
| 1 | 1 | 1 | 1 | +4 |
| 1 | 1 | 1 | 0 | +3 |
| 1 | 1 | 0 | 0 | +2 |
| 1 | 0 | 0 | 0 | +1 |
| 0 | 0 | 0 | 0 | 0 |
| 0 | 0 | 0 | −1 | −1 |
| 0 | 0 | −1 | −1 | −2 |
| 0 | −1 | −1 | −1 | −3 |
| −1 | −1 | −1 | −1 | −4 |

Here, i=(1~n/2) and j=(n/2+1~n).

In the case where there are 4 (m=4) unit cells as is shown in FIG. 1 and Table 1, it is possible to take the values −4, −3, −2, −1, 0, 1, 2, 3, 4 (2m+1=9) for the output Y. For example, in the case of outputting 0, if 4 unit cells among 8 unit cells are selected by 0, it is possible to output 0.

A D/A converter which uses a multi-value selection signal such as 3 values as is shown in FIG. 1 and Table 1, can reduce the number of unit cells lower than the number of values that can be taken of the output Y. Therefore, because the number of unit cells required for configuring a D/A converter can be reduced, and the required circuit scale, number of parts and area required for installment can be reduced, it is possible to reduce consumption power.

However, a conventional selection device which uses a multi-level selection signal such as 3 values (−1, 0, 1) has the following problem.

For example, when the total of outputs of unit cells by an adder should be 0, in the case where a 3 value selection signal (−1, 0, 1) is used, the output of a value 0 is instructed to 8 unit cells. In other words, 0 is output as the total by not selecting any of the 8 unit cells. In an oversampling D/A converter, in the case where a value close to 0 is output, a value close to 0 is output by the time average between a state in which 1 unit cell is selected among 8 unit cells and a state in which none of the 8 unit cells are selected. In other words, among the selection signals the frequency with which −1, 1, are output decreases. That is, in the case of a 3 value selection signal (−1, 0, 1,), the frequency of outputting a selection signal which is not 0 decreases when outputting a level close to Y=0. In this way, the number of selected unit cells is reduced.

FIGS. 2(a) and (b) shows modes in which unit cells Ym are selected in the time direction, by comparing the cases of (a)(FIG. 2(a)) where a selection device is used and (b)FIG. 2(b)) where a selection device is not used, in the case where a 3 value selection signal (−1, 0, 1) is used.

In the examples in FIG. 2, a D/A converter outputs a signal close to 0, that is, a selection signal so that either 0 or 1 among 4 is selected in turns. As shown in the diagram, a selection signal from the selection device is similarly output so that either 0 or 1 among 4 is selected in turns. In both cases, the same number of unit cells are selected, and in the case where a selection device is not used, a selection signal from a D/A converter always selects the same unit cell, whereas in the case where a selection device is used, the unit cell which is selected by a selection signal from the selection device changes with time. In FIG. 2, in the case where a selection device is used, an algorithm is used which selects in order cells which are not selected. As a result, at first, (0001) the same as an input is selected, and (0000) is selected in the next time period, and because (0000) is also selected in the next time period, it takes time for all the unit cells to be output equally.

As stated above, in the error diffusion technology, by changing each time the method by which a unit cell is selected, the error is smoothed by equally using all the unit cells. Therefore, when the time required for using unit cells equally becomes longer, the error diffusion effects become weaker and the influence of the error on the unit cells cannot be removed.

As explained above, in the case where the error diffusion technology is used in a selection device which selects a unit cell using a 3 value selection signal (−1, 0, 1), because it is possible to reduce the number of unit cells lower than the number of values which can be output, the number of unit cells necessary for configuring a D/A converter can be decreased, the required circuit scale and number of parts and required area for realizing a semiconductor can be reduced and power consumption can also be reduced. However, when the total of unit cell outputs is a value close to 0 by a selection signal from a D/A converter, the number of cells selected by a selection signal from the selection device decreases. As a result, the time for smoothing the error becomes longer and the effects of the error diffusion become weaker.

In particular, a digital speaker system is proposed in WO2007/135928A1 which directly converts a digital signal into an analog signal using a circuit input with a digital audio signal and which outputs a plurality of digital signals and a plurality of coils (units) which are driven by the plurality of digital signals. In order to realize this digital speaker system, it is preferable to select a unit cell using a 3 value selection signal (−1, 0, 1) in order to secure an SNR with as few coils as possible. In addition, because a manufacturing error of a coil which is a mechanical part has a larger variation error compared to a semiconductor electronic part and can not be ignored, a selection device which has sufficient error diffusion effects is necessary for realizing a digital speaker system.

SUMMARY

One object of the present invention is to solve the problem whereby the number of unit cells selected by a selection signal from a selection device is reduced in the case where a 3 value selection signal (−1, 0, 1) is used when using error diffusion technology in a selection device for selecting a unit cell and in particular, when the total of outputs of unit cells selected by selection signals from a D/A converter is close to 0. In addition, another object of the present invention is to solve the problems whereby the time for smoothing an error becomes longer and the effects of error diffusion become weaker due a decrease in the number of unit cells selected by a selection signal.

As one embodiment of the present invention, a selection device comprising: an acquisition part which acquires a digital selection signal; and an output part which outputs a selection signal to each of a plurality of unit cells which can be instructed to output a value 0;

wherein the selection signal instructs an output of a value corresponding to the selection signal to the unit cell; the total of a value of outputs instructed by the selection signals output to the plurality of unit cells is a value determined according to the digital selection signal; and when the output corresponding to the digital selection signal is value 0, a unit cell exists which is output with a selection signal which instructs an output of a value N which is not 0. Here "output of value 0" means an output the value of which is 0. In addition, "output of a value N which is not 0" means an output the value of which is not 0 and a result of measuring the output is indicated by a numerical value N.

According to the present invention, it is possible to prevent a weakening of the effects of the error diffusion when outputting a value 0 or a value close to 0 in the case where an error diffusion technology is used in a selection device which selects a unit cell using a 3 value selection signal (−1, 0, 1). In addition, by the present invention it is possible to reduce by half the number of unit cells compared to the case where the number of unit cells output 2 values by using a 3 value selection signal (−1, 0, 1).

BRIEF DESCRIPTION OF THE DRAWINGS

FIGS. 2(a) and (b) are diagrams which explain the operation principles of a selection device used in a conventional example of a D/A converter which uses a 3 value selection signal;

FIGS. 10(a) and (b) are diagrams which explain the operation principles of a selection device which selects 0 by a 3 value selection signal related to an embodiment of the present invention;

DESCRIPTION OF EMBODIMENTS

The operating principles of the present invention are explained as embodiments while referring to the diagrams. Furthermore, it should be noted that the present invention is in no way limited to the embodiments explained below. The present invention can be carried out with changes and modifications without departing from the spirit and the scope of the invention. For example, while in the explanation below the cases where a 3 value selection signal is mainly used are explained, the present invention is not limited to a 3 value selection signal and it is possible to carry out the present invention even in the case where a general multiple value selection signal is used.

Figure 1:
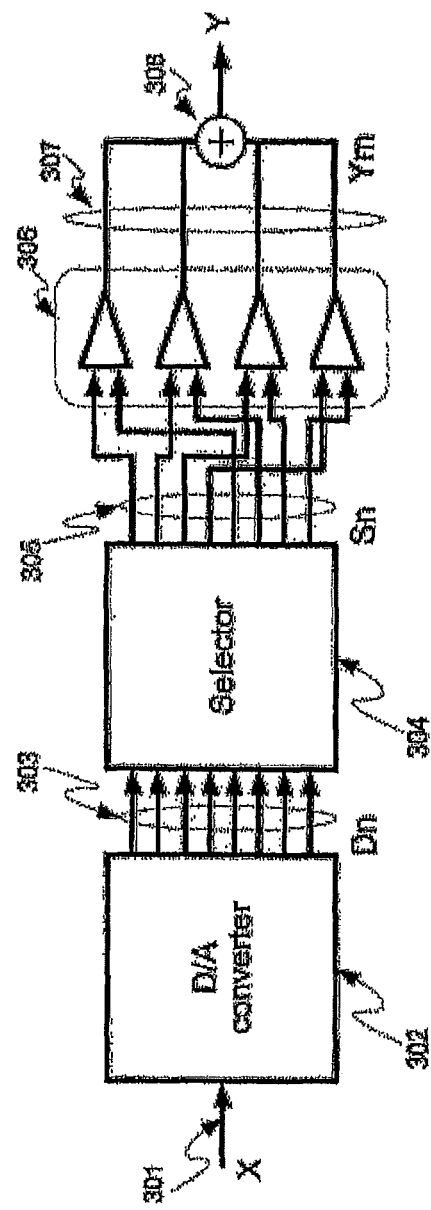
FIG. 1 is a schematic diagram of a conventional example of a D/A converter which uses a 3 value selection signal.
Figure 3:
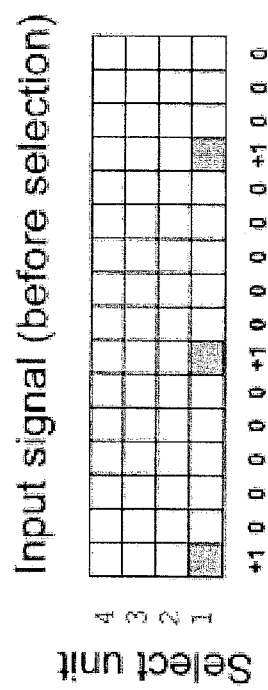
FIGS. 3(a) and (b) are diagrams which explain the operation principles of a selection device used in a D/A converter related to one embodiment of the present invention which uses a 3 value selection signal.
Figure 3:
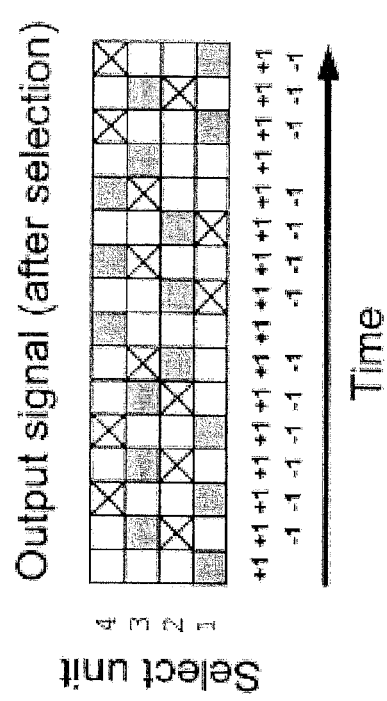

As one embodiment of the present invention, FIGS. 3(a) and (b) show a mode in which unit cells are selected in the time direction by comparing the cases (a)(FIG. 3(a)) in which the selection device of the present invention is not used and in the case (b)(FIG. 3(b)) in which the selection device of the present invention is used, where a 3 value selection signal (−1, 0, 1) is used.

In this example, a D/A converter outputs a signal close to 0, that is, a selection signal so that either 0 or 1 among 4 is selected in turns. A selection signal is output so that a value 0 is output to a selection cell which is not selected. On the other hand, with regards to the selection signal from the selection device of the present invention, when the total of the output of the unit cell becomes 0, it is not the case in which 0 unit cell from 4 unit cells is selected (no unit cell is selected); and a selection signal is output for performing an instruction for the output of +1 and −1 to 2 unit cells. When 2 unit cells perform output corresponding to +1 and −1 respectively, a level equivalent to 0 is output because these outputs are balanced by the adder. Furthermore, a signal which performs an instruction for the output of +1 is sometimes called "a selection signal which instructs for an output of a +1 value." Similarly, a selection signal which performs an instruction for the output of −1 is sometimes called "a selection signal which instructs for an output of a −1 value."

In this way, when the total of the output of a unit cell becomes 0, the selection device outputs an instruction for outputs of +1 and −1 to 2 unit cells, which is not equivalent to that 0 unit cell among 4 unit cells not selected (no unit cell is selected). In this way, the length of time for smoothing errors does not increase and there is no degradation of the effects of error diffusion.

In a conventional selection device, in the case where the total of an output of a unit cell is instructed by a signal input to a selection signal (herein after called a digital selection signal, for example) to become 0, it is only the case in which 0 unit cell is selected among 4 unit cells. In other words, a selection signal is output so that all the unit cells output a value 0. However, one feature of the selection device of the present invention is that value 0 of the result of adding is output by instructing some unit cells to output corresponding to +1 and −1. In addition, it is possible to instruct for each unit cell to perform an output corresponding to each of +2 and −2. Furthermore, it is possible to instruct for two unit cells to perform outputs corresponding to outputting +1 and for a unit cell to perform an output corresponding to −1. Generally, it is one of the features of the present invention that the sum of the total value of the outputs of unit cells which are instructed to perform outputs corresponding to positive values and the total value of the outputs of unit cells which are instructed to perform outputs corresponding to negative values becomes 0.

Figure 4:
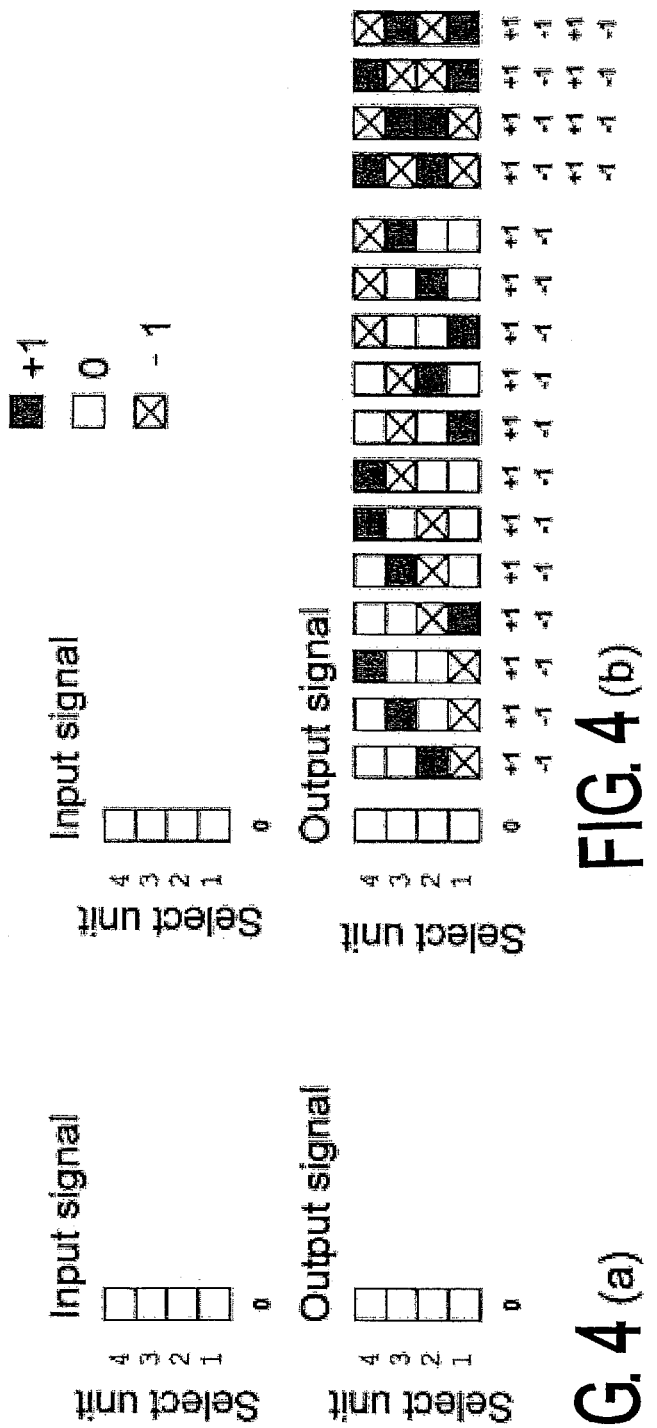
FIGS. 4(a) and 4(b) are comparison diagrams of the operations of a selection device which selects 0 by a conventional 3 value selection signal and the operation of a selection device which selects 0 by a 3 value selection signal of the present invention.

FIGS. 4(*a*) and (*b*) shows a comparison of (a)(FIG. 4(*a*)) a conventional example and (b)(FIG. 4(*b*)) an example by one embodiment of the present invention, in the case where the total of the outputs of unit cells becomes 0 with regards to a combination of signals output by a selection device. According to the selection device related to one embodiment of the present invention, it is understood that the number of unit cells which are instructed to output non-zero by a selection signal increases. Furthermore, while the explanation above was related only to the case where the total of the outputs of unit cells becomes 0, one embodiment of the present invention is also effective in the case where the total of the outputs other is than 0, that is, when m−2 or less among m is selected and output is performed. In the case where m−2 or more is selected and output is performed, no problem arises because the number of selected unit cells increases and even in the case where a unit cell is selected using a 3 value selection signal (−1. 0, 1), there is no degradation of the effects of error diffusion.

Figure 5:
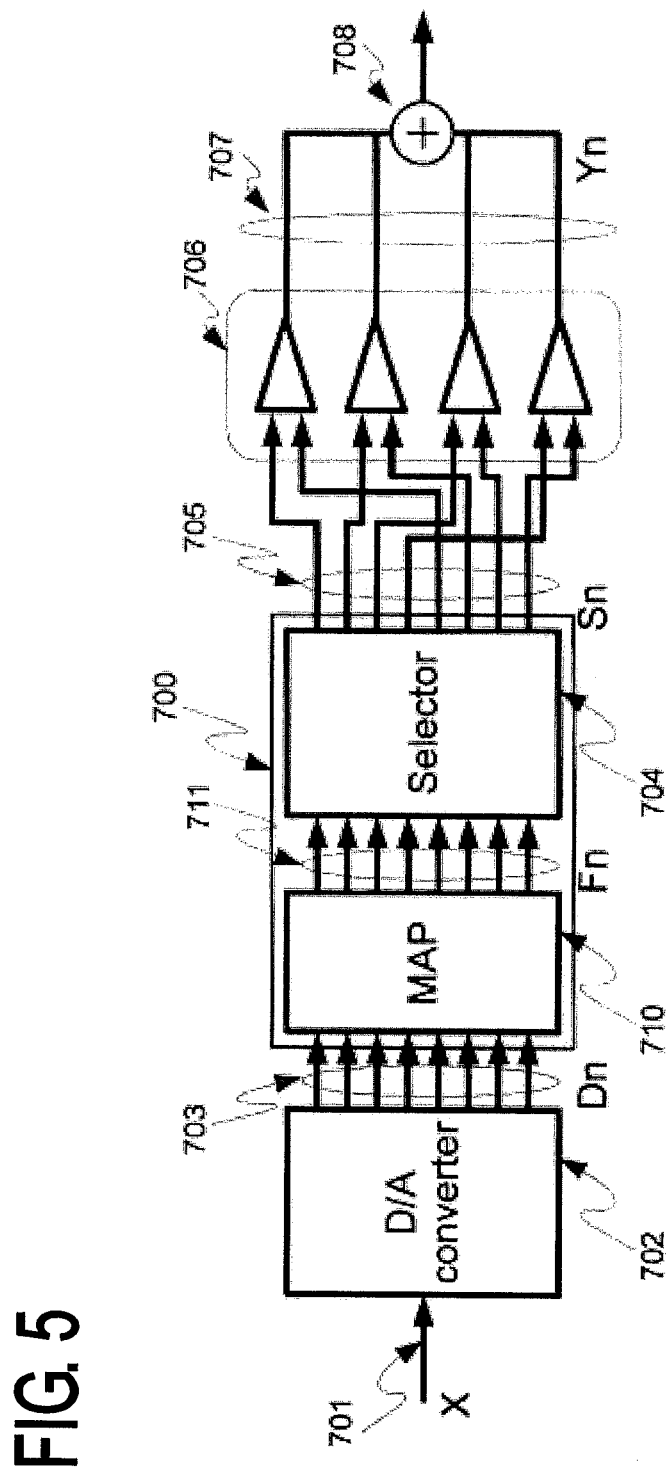
FIG. 5 is a schematic diagram of a D/A converter which uses a selection device related to a first embodiment of the present invention.

A first example of a D/A converter which uses a selection device (700) of the present invention is shown in FIG. 5. A digital signal X (701) is input to the D/A converter (700) and a plurality of digital selection signals Dn (703) which are obtained are input to a conversion table circuit (710) and a plurality of second digital selection signals Fn (711) are obtained. The second digital selection signals are input to a selection device (704) and a plurality of selection signals Sn (705) are obtained from the selection device (704). The plurality of selection signals Sn (705) select a plurality of unit cells (706), outputs Ym (707) of the plurality of unit cells are totaled together by an adder (708) and an output signal Y is obtained.

Table 2 shows truth tables for a plurality of first digital selection signals Dn from a D/A converter, a plurality of second digital selection signals Fn from the conversion table circuit, and output signals Ym from unit cells. The truth table for the plurality of the first digital selection signals Dn is shown on the left, the truth table for the plurality of the second digital selection signals Fn from a conversion table circuit is shown in the middle, and the truth table for output signals Ym of unit cells is shown on the right.

TABLE 2

Truth table of D/A output signal (Dn)

| X | D0 | D1 | D2 | D3 | D4 | D5 | D6 | D7 |
|---|---|---|---|---|---|---|---|---|
| +4 | 0 | 0 | 0 | 0 | 1 | 1 | 1 | 1 |
| +3 | 0 | 0 | 0 | 0 | 1 | 1 | 1 | 0 |
| +2 | 0 | 0 | 0 | 0 | 1 | 1 | 0 | 0 |
| +1 | 0 | 0 | 0 | 0 | 1 | 0 | 0 | 0 |
| 0 | 0 | 0 | 0 | 0 | 0 | 0 | 0 | 0 |
| −1 | 0 | 0 | 0 | 1 | 0 | 0 | 0 | 0 |
| −2 | 0 | 0 | 1 | 1 | 0 | 0 | 0 | 0 |
| −3 | 0 | 1 | 1 | 1 | 0 | 0 | 0 | 0 |
| −4 | 1 | 1 | 1 | 1 | 0 | 0 | 0 | 0 |

TABLE 2-continued

| Truth table of MAP (Fn) | | | | | | | | Truth table cell selection (Ym) | | | | |
|---|---|---|---|---|---|---|---|---|---|---|---|---|
| F0 | F1 | F2 | F3 | F4 | F5 | F6 | F7 | Y0 | Y1 | Y2 | Y3 | Y |
| 0 | 0 | 0 | 0 | 1 | 1 | 1 | 1 | 1 | 1 | 1 | 1 | +4 |
| 0 | 0 | 0 | 0 | 1 | 1 | 1 | 0 | 1 | 1 | 1 | 0 | +3 |
| 0 | 0 | 0 | 0 | 1 | 1 | 0 | 0 | 1 | 1 | 0 | 0 | +2 |
| 0 | 0 | 0 | 0 | 1 | 0 | 0 | 0 | 1 | 0 | 0 | 0 | +1 |
| 0 | 0 | 0 | 1 | 1 | 0 | 0 | 0 | 1 | 0 | 0 | −1 | 0 |
| 0 | 0 | 0 | 1 | 0 | 0 | 0 | 0 | 0 | 0 | 0 | −1 | −1 |
| 0 | 0 | 1 | 1 | 0 | 0 | 0 | 0 | 0 | 0 | −1 | −1 | −2 |
| 0 | 1 | 1 | 1 | 0 | 0 | 0 | 0 | 0 | −1 | −1 | −1 | −3 |
| 1 | 1 | 1 | 1 | 0 | 0 | 0 | 0 | −1 | −1 | −1 | −1 | −4 |

By outputting Fn=(00011000) in the case where Dn=(00000000) is input to the conversion table circuit, when the total of the outputs of the unit cells becomes 0, 0 unit cell is not selected among 4 unit cells but it is possible to output a selection signal in order to instruct 2 unit cells to perform outputs corresponding to +1 and −1.

It is possible to obtain one effect of the present invention by arranging an arbitrary conversion table circuit as a stage before a conventional selection device as is shown in the selection device (700) of the present invention.

Figure 6:
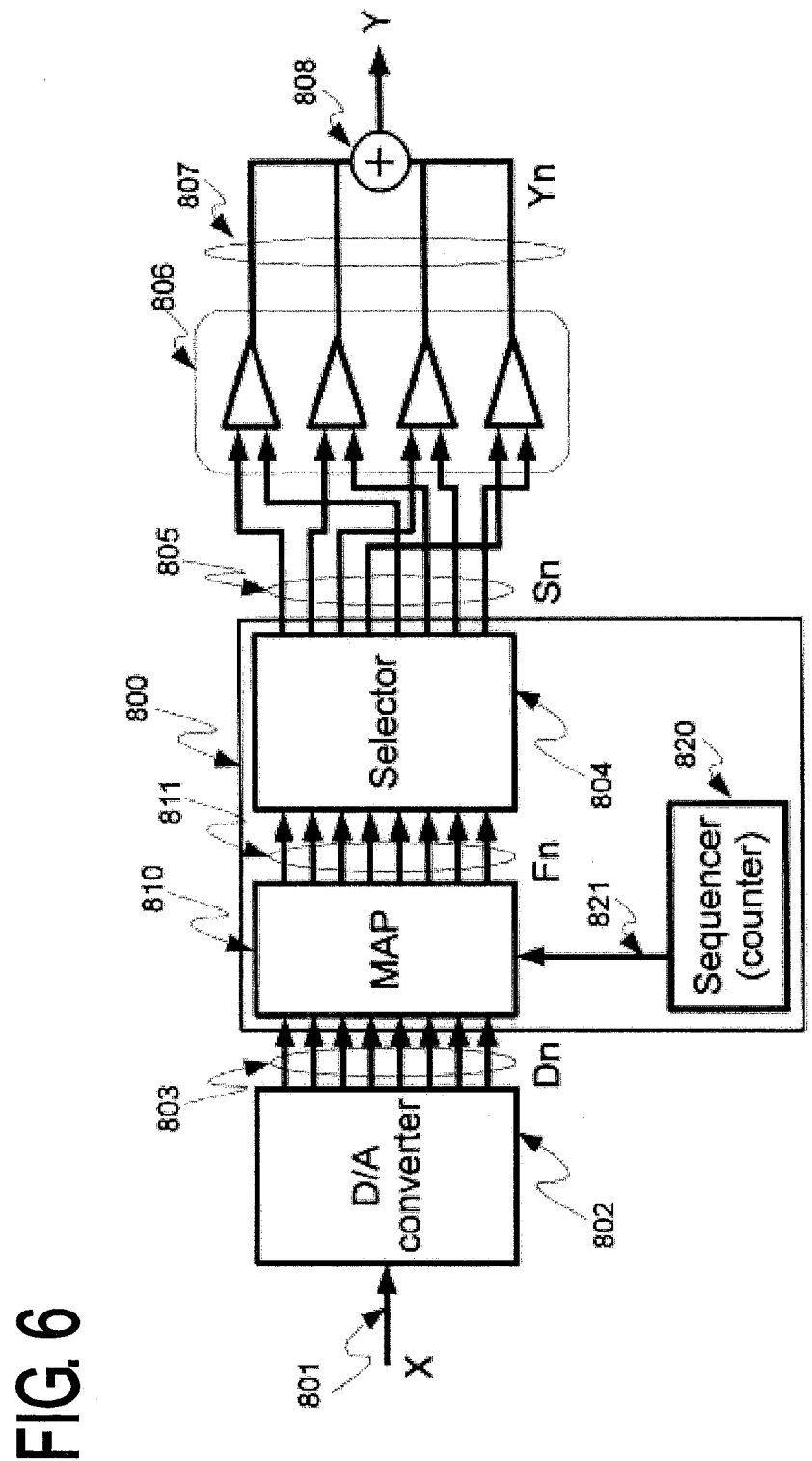
FIG. 6 is a schematic diagram of a D/A converter which uses a selection device related to a second embodiment of the present invention.

A second example of a D/A converter which uses a selection device (800) related to one embodiment of the present invention is shown in FIG. 6. A digital signal X (801) is input to the D/A converter (800) and a plurality of first digital selection signals Dn (803) which are obtained are input to a conversion table circuit (810) and a plurality of second digital selection signals Fn (811) are obtained. The second digital selection signals are input to a selection device (804) and a plurality of selection signals Sn (805) are obtained from the selection device (804). The plurality of selection signals Sn (805) select a plurality of unit cells (806), outputs Ym (807) of the plurality of unit cells are totaled together by an adder (808) and an output signal Y is obtained. A control signal (821) from a sequential control circuit (820) is input to the conversion table circuit (810).

A plurality of conversion tables is included in the conversion table circuit (810) in the second example, and one is selected among the plurality of conversion tables by the control signal (821) from the sequential control circuit (820). If the sequential control circuit is formed with a counter circuit, it is possible to have a configuration where a unique conversion table is selected in order among the plurality of conversion tables. It is possible to configure the sequential control circuit with an arbitrary sequential circuit such as a random signal generation circuit.

A truth table of the first digital selection signal Dn from the D/A converter of the second example, a truth table of the second digital selection signal Fn from the conversion table circuit, and a truth table of output signals Ym of unit cells are shown in table. 3. The truth table for a plurality of the first digital selection signals Dn is shown on the left of table 3, the truth table for a plurality of the second digital selection signals Fn from a conversion table circuit is shown in the middle of table 3, and the truth table for output signals from unit cells is shown on the right of table 3. Two types of signal Fn=(00011000) and Fn=(00111100) can be selected in the case where the conversion table circuit is input with Dn=(00000000). When the selection device outputs 0, 0 unit cell from 4 cells is not selected, but a selection signal is output so that two unit cells become +1 and −1, or a selection signal is output so that 4 unit cells become +1 +1 and −1-1, is selected by a control signal from the sequential control circuit.

TABLE 3

Truth table of D/A output signal (Dn)

| X  | D0 | D1 | D2 | D3 | D4 | D5 | D6 | D7 |
|----|----|----|----|----|----|----|----|----|
| +4 | 0  | 0  | 0  | 0  | 1  | 1  | 1  | 1  |
| +3 | 0  | 0  | 0  | 0  | 1  | 1  | 1  | 0  |
| +2 | 0  | 0  | 0  | 0  | 1  | 1  | 0  | 0  |
| +1 | 0  | 0  | 0  | 0  | 1  | 0  | 0  | 0  |
| 0  | 0  | 0  | 0  | 0  | 0  | 0  | 0  | 0  |
| −1 | 0  | 0  | 0  | 1  | 0  | 0  | 0  | 0  |
| −2 | 0  | 0  | 1  | 1  | 0  | 0  | 0  | 0  |
| −3 | 0  | 1  | 1  | 1  | 0  | 0  | 0  | 0  |
| −4 | 1  | 1  | 1  | 1  | 0  | 0  | 0  | 0  |

Truth table of MAP (Fn)

| F0 | F1 | F2 | F3 | F4 | F5 | F6 | F7 |
|----|----|----|----|----|----|----|----|
| 0  | 0  | 0  | 0  | 1  | 1  | 1  | 1  |
| 0  | 0  | 0  | 0  | 1  | 1  | 1  | 0  |
| 0  | 0  | 0  | 0  | 1  | 1  | 0  | 0  |
| 0  | 0  | 0  | 0  | 1  | 0  | 0  | 0  |
| 0  | 0  | 1  | 1  | 1  | 1  | 0  | 0  |
| 0  | 0  | 0  | 1  | 1  | 0  | 0  | 0  |
| 0  | 0  | 0  | 1  | 0  | 0  | 0  | 0  |
| 0  | 0  | 1  | 1  | 0  | 0  | 0  | 0  |
| 0  | 1  | 1  | 1  | 0  | 0  | 0  | 0  |
| 1  | 1  | 1  | 1  | 0  | 0  | 0  | 0  |

Truth table cell selection (Ym)

| Y0 | Y1 | Y2 | Y3 | Y  |
|----|----|----|----|----|
| 1  | 1  | 1  | 1  | +4 |
| 1  | 1  | 1  | 0  | +3 |
| 1  | 1  | 0  | 0  | +2 |
| 1  | 0  | 0  | 0  | +1 |
| 1  | 1  | −1 | −1 | 0  |
| 1  | 0  | 0  | −1 | 0  |
| 0  | 0  | 0  | −1 | −1 |
| 0  | 0  | −1 | −1 | −2 |
| 0  | −1 | −1 | −1 | −3 |
| −1 | −1 | −1 | −1 | −4 |

In table 3, an example of a conversion table circuit having a plurality of types of output, for example 2, outputs Fn=(00011000) and Fn=(00111100) with respect to Dn=(00000000) is shown, however, a plurality of Fn maybe corresponded to an arbitrary Dn. In addition, an output Fn=(00000000) may also be corresponded with Dn=(00000000), which is a conventional example. Because the output Fn=(00000000) does not have a selected unit cell, the amount of power consumed by a selected cell becomes smaller. It is possible to optimize consumption power and error diffusion effects in a selected cell by outputting the output Fn=(00000000) at an appropriate frequency with respect to the conventional example Dn=(00000000).

Figure 7:
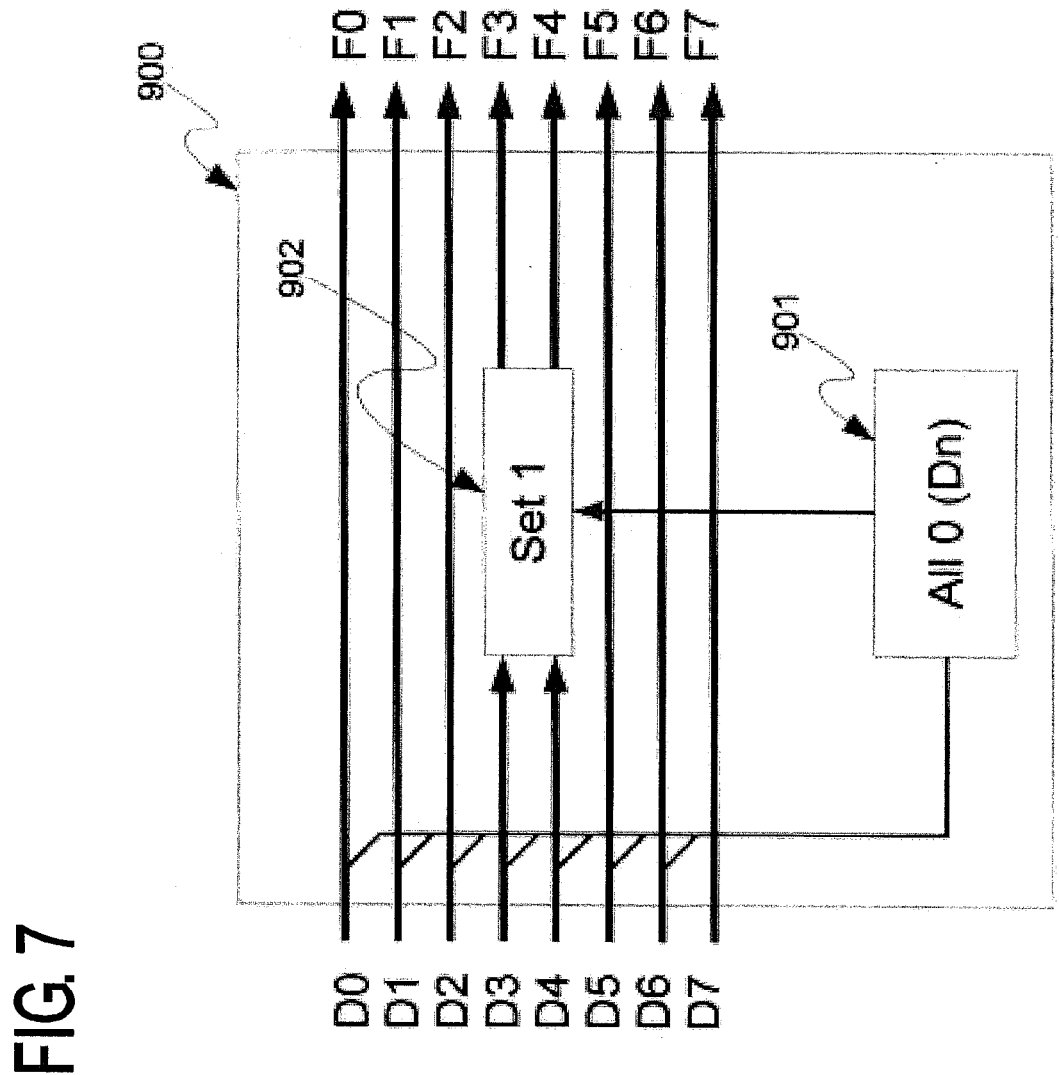
FIG. 7 is a diagram of a conversion table circuit of used in a selection device related to an embodiment of the present invention.

An example of a conversion table circuit (900) of the present invention is shown in FIG. 7. The conversion table circuit of the present example outputs an output Fn=(00011000) with respect to Dn=(00000000). The conversion table circuit is comprised of a circuit (901) which detects that Dn is (00000000) and a set circuit (902) which receives a signal from the detection circuit and outputs Fn=(00011000). An arbitrary logic circuit or memory circuit or an adder and subtractor can be used in the conversion table circuit other than the present example.

Figure 8:
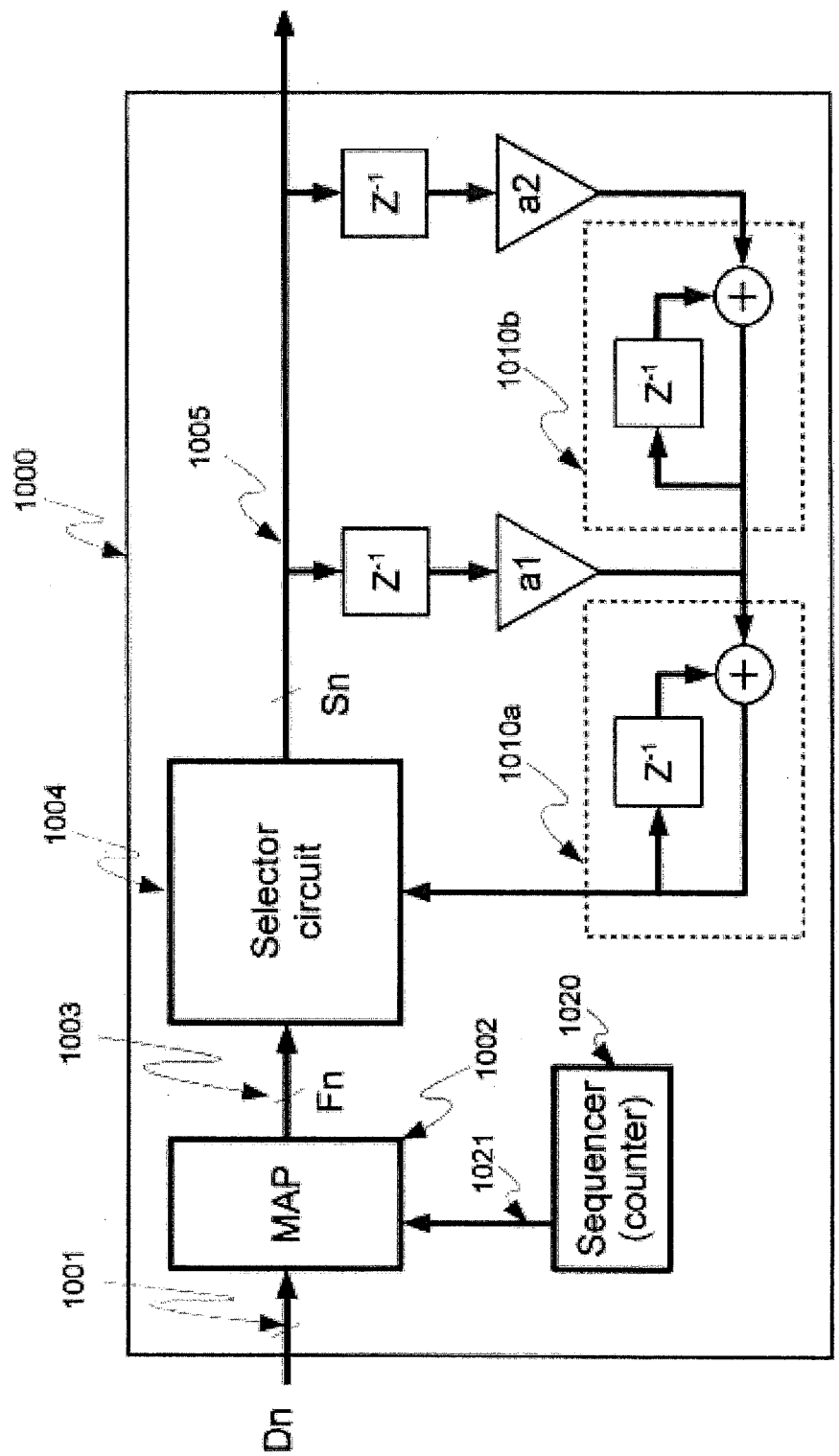
FIG. 8 is a schematic diagram of a selection device of a third embodiment of the present invention.

A third example of the present invention is shown in FIG. 8. A first digital selection signal Dn (1001) and a plurality of second digital selection signals Fn (1003) from a conversion table circuit (1002) are provided and the second digital selection signals Fn are input to a selection circuit (1004). With regard to 3 value selection signals Sn (1005) from a selection circuit, the selection circuit operates so that unit cells are selected in order of low selection frequency by calculating the usage frequency of a unit cell by a selection signal with at least 2 or more integration circuits (1010a, 1010b) and by a delay element and an adder. The conversion table circuit (1002) is input with a control signal (1021) from a sequential control circuit (1020).

The examples of the present invention are not limited to the first to third examples. For example, by arranging an arbitrary conversion table circuit between a D/A converter and an error diffusion selection circuit, it is possible to configure a selection device which outputs a selection signal so that an even number of unit cells output +1 and −1 instead of outputting 0s. At this time, the number of unit cells which output +1 and the number of cells which output −1 become equal.

While an example of a general D/A converter is used in the first to third examples of the present invention, it is possible to adopt a digital speaker system as a specific example of a D/A converter. For example, as is proposed in WO2007/1359281A1, one embodiment of the present invention can also be applied to a selection device for a digital speaker system which directly converts a digital signal to analog audio using a circuit which is input with a digital audio signal and outputs a plurality of digital signals and a plurality of coils (units) driven by the plurality of digital signals. The present invention can also be used in a selection device for a digital speaker system which drives a coil using a 3 value selection signal for securing a necessary SNR with few coils.

Figure 9:
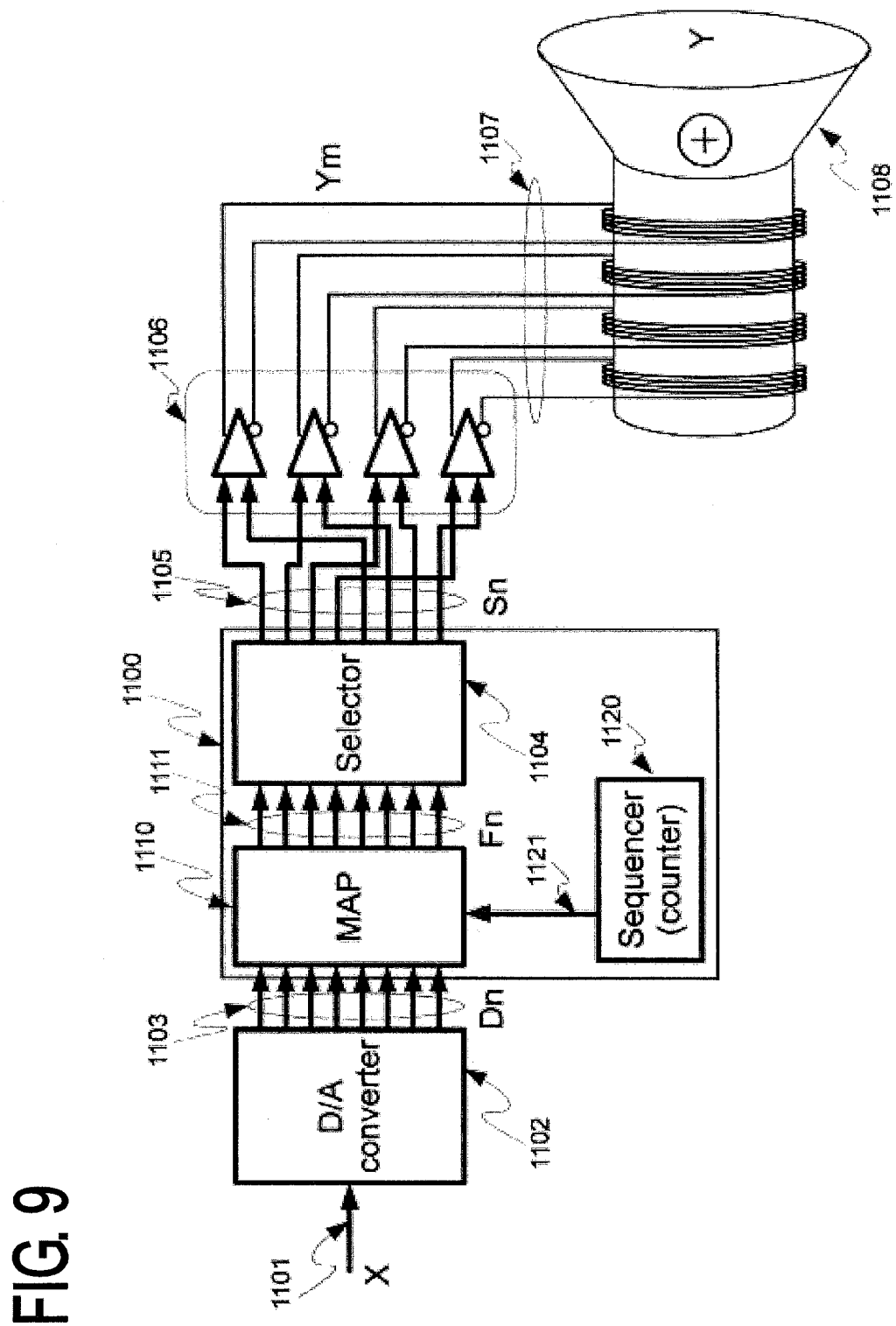
FIG. 9 is a schematic diagram of a digital speaker system which uses a selection device related to a fourth embodiment of the present invention.

A fourth example of a digital speaker system which uses a selection device (1100) of the present invention is shown in FIG. 9. A digital signal X (1101) is input to a D/A converter (1102) and the obtained plurality of first digital selection signals Dn (1103) is input to a conversion table circuit (1110) and a plurality of second digital selection signals Fn (1111) are obtained. The second digital signal is input to a selection device (1104) and a plurality of selection signals Sn (1105) are obtained from the selection device (1104). The plurality of selection signals Sn (1105) select a plurality of unit cells (1106) and a plurality of outputs Ym (1107) of the unit cells are totaled by a speaker device (1108) comprised of a plurality of coils (units) and an output signal Y is obtained. A control signal (1111) from a sequential control circuit (1120) is input to the conversion table circuit (1110)

A second operation example of a selection device of the present invention is shown in FIGS. 10(a) and (b). FIGS. 10(a) and (b) compare the case (a)FIG. 10(a)) when a selection device related to one embodiment of the present invention is not used and (b)(FIG. 10(b)) when a selection device related to one embodiment of the present invention is used, in a time direction of selections of unit cells Ym in the case of using a 3 value (−1, 0, +1) selection signal.

The same as the explanation above, a signal close to 0 is output by the total of outputs of unit cells both in the case when a selection device related to one embodiment of the present invention is used and in the case it is not used as shown in FIGS. 10(a) and (b). In other words, a selection signal which selects 0 or 1 unit cell among 4 unit cells in turns is output. In the second operation example of the selection device related to one embodiment of the present invention, when the total of outputs of unit cells becomes 0, a selection signal does not select 0 unit cell among 4 unit cells, but operates so that a selection signal is output which instructs that −1 is output when 0 is to be output again after once instructing an output of +1. In the first operation example of a selection device related to one embodiment of the present invention a selection signal is output so that +1 and −1 are output at once, while in the second operation example of a selection device of the present invention, 0 is output by instructing a unit cell to output +1 and −1 in time series. 0 is output because +1 and −1 are cancelled out in time series by an adder circuit. That is, the total of an output of a unit cell becomes 0 by taking a time average.

As is the same as the first operation example of the selection device related to one embodiment of the present invention, 0 unit cell is not selected among 4 unit cells when 0 is to be output, but when the selection device outputs a selection signal so that 1 unit cell becomes +1 and −1 in time series, the length of time for smoothing errors does not increase and the effects of error diffusion are not lost.

Figure 11:
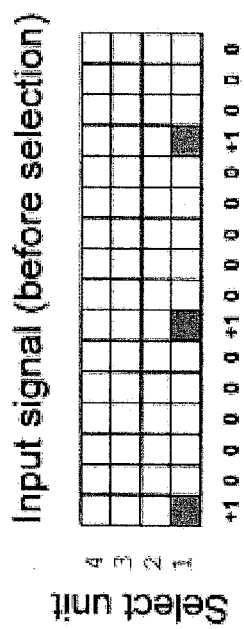
FIGS. 11(a) and (b) are diagrams which explain the operation principles of a selection device which selects 0 by a 3 value selection signal related to an embodiment of the present invention.
Figure 11:
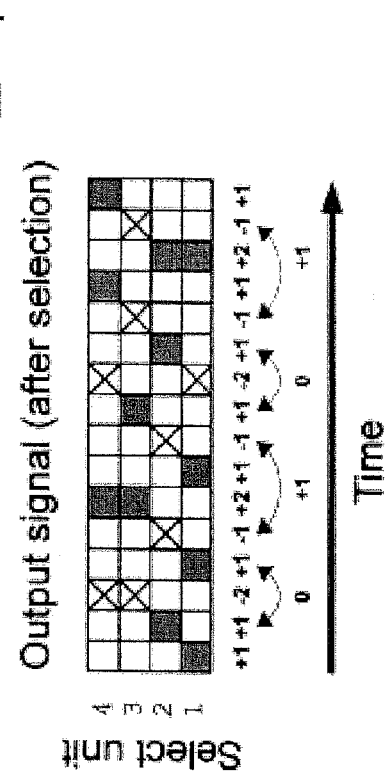

A third operation example of a selection device related to one embodiment of the present invention is shown in FIGS. 11(a) and (b). FIGS. 11(a) and (b) compare the case (a)(FIG. (a)) when a selection device related to one embodiment of the present invention is not used and (b)(FIG. (b)) when a selection device related to one embodiment of the present invention is used, in a time direction of selections of unit cells Ym in the case of using a 3 value (−1. 0, +1) selection signal.

As is the same as the explanation above, a signal close to 0, that is, a selection signal which selects 0 or 1 unit cell among 4 unit cells in turns is output. In the third operation example of the selection device related to one embodiment of the present invention, when the total of outputs of unit cells becomes 0, a selection signal does not select 0 unit cell among 4 unit cells, but operates so that a selection signal is output which instructs that −2 (+2) is output when 0 is output again after once instructing an output of +1 (−1), and when 0 is output again, instructs a unit cell so that +1 (−1) is output. In the first operation example of a selection device related to one embodiment of the present invention, for example, a selection signal is output so that +1 and −1 are respectively output at once by an even number of unit cells, while in the second operation example of a selection device related to one embodiment of the present invention, 0 is output by instructing one or a plurality of unit cells to output +1, −2 and +1 in time series. 0 is output because +1, −2 and +1 are cancelled out in time series by an adder. In this case also, the average time of the total of an output of a unit cell is 0.

As is the same as the first operation example of the selection device related to one embodiment of the present invention, 0 unit cell is not selected among 4 unit cells when 0 is to be output, but when the selection device outputs a selection signal so that the output of a unit cell becomes +1, −2 and +1 in time series, the length of time for smoothing errors does not increase and the effects of error diffusion are not lost.

Figure 12:
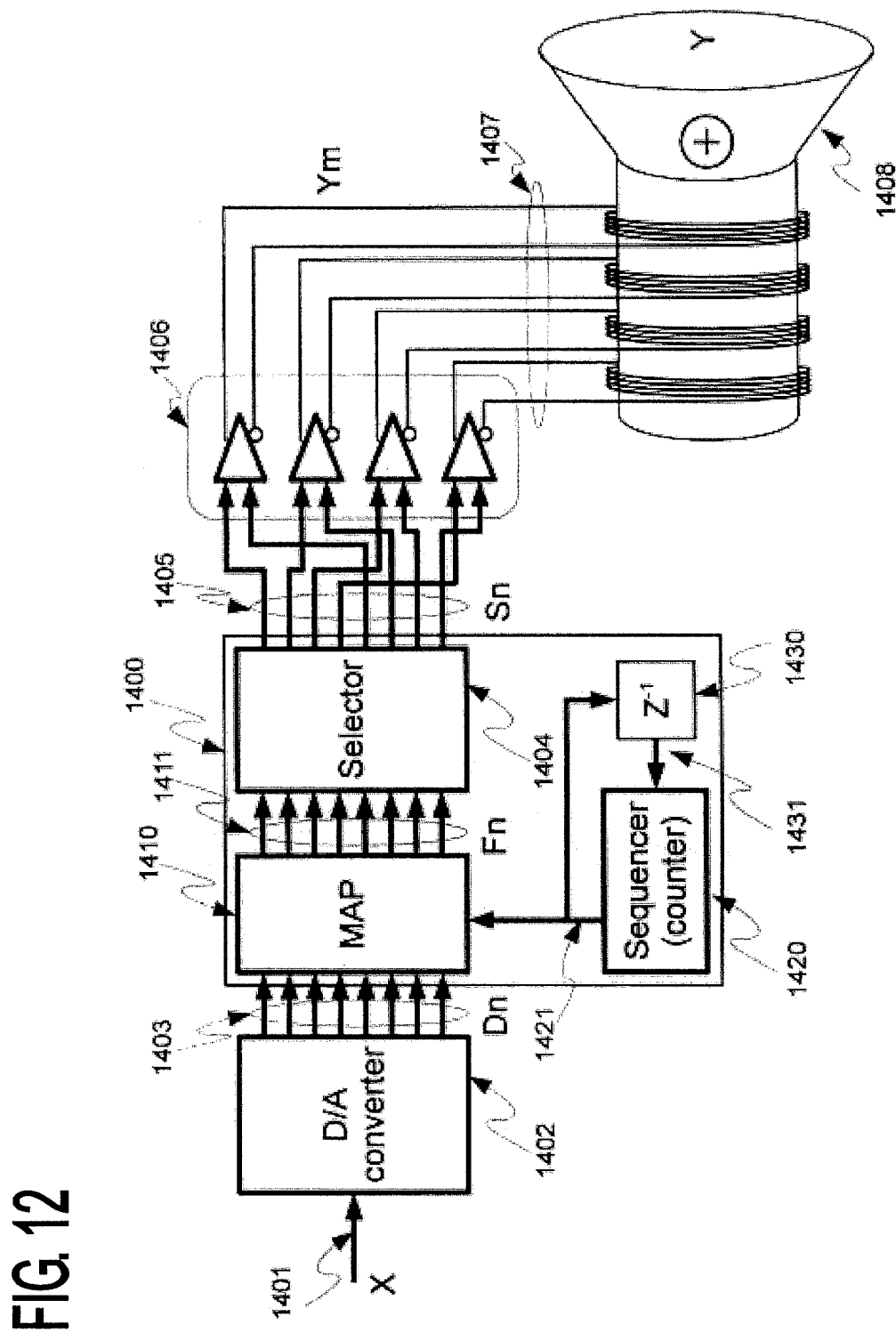
FIG. 12 is a schematic diagram of a digital speaker system which uses a selection device related to a fifth embodiment of the present invention

A fifth example of a digital speaker system which uses a selection device (1400) related to one embodiment of the present invention is shown in FIG. 12. A digital signal X (1401) is input to a D/A converter (1402) and the obtained plurality of first digital selection signals Dn (1403) are input to a conversion table circuit (1410) and a plurality of second digital selection signals Fn (1411) are obtained. The second digital signal is input to a selection device (1404) and a plurality of selection signals Sn (1405) are obtained from a selection device (1404). The plurality of selection signals Sn (1405) select a plurality of unit cells (1406) and a plurality of outputs Ym (1407) of the unit cells are totaled by a speaker device (1408) comprised of a plurality of coils (units) and an output signal Y is obtained. A control signal (1421) from a sequential control circuit (1420) is input to the conversion table circuit (1410). The control signal (1411) is input to a circuit which includes at least one or more delay elements (1430) and the output signal (1431) is fed back to a sequential control circuit (1420)

By feeding back control data of a MAP circuit (1410) to a sequential control circuit via a delay device as is shown in FIG. 12, it is possible to realize a circuit which cancels out an output value in time series such as that in the second and third operation examples of the selection device described above.

Figure 13:
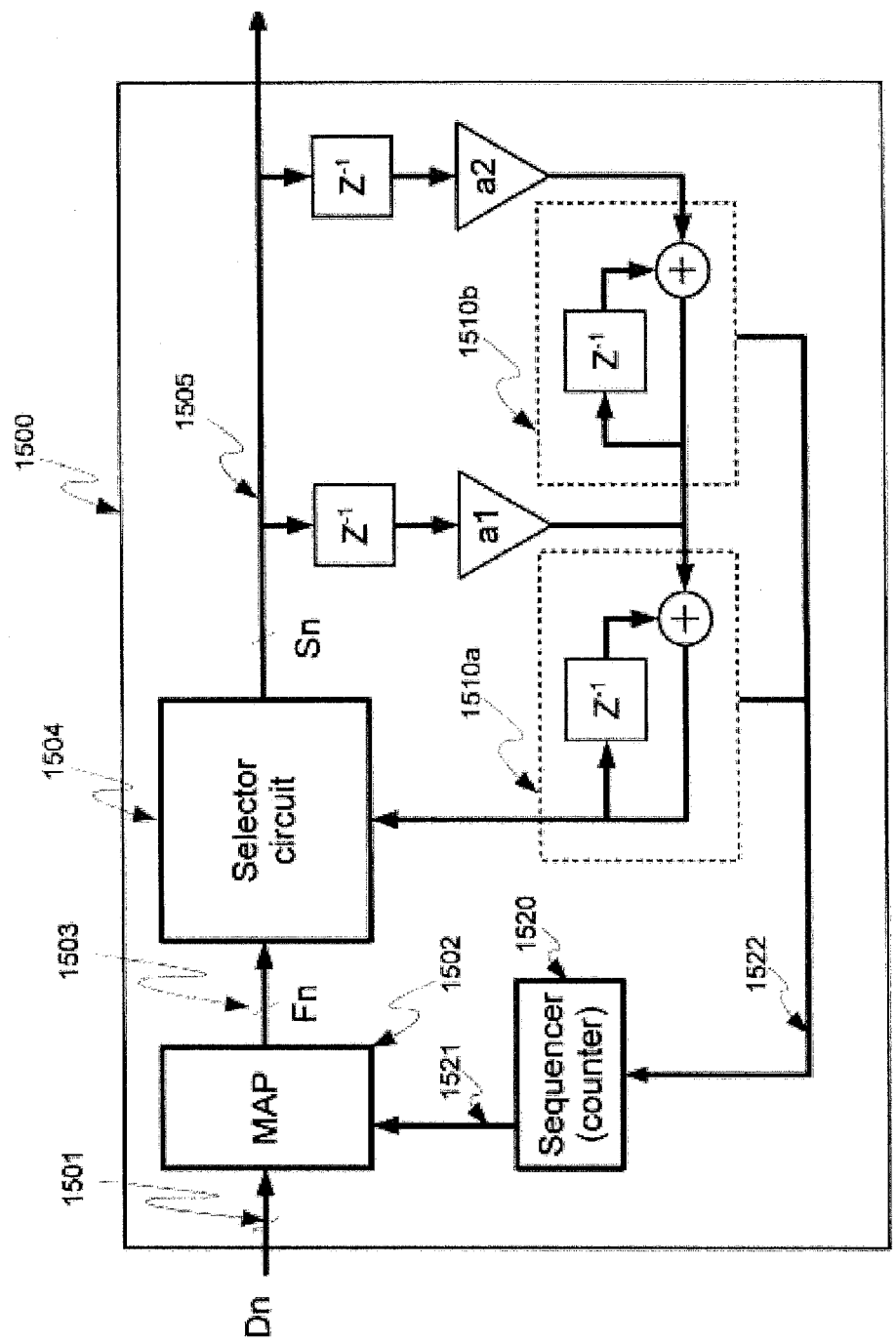
FIG. 13 is a schematic diagram of a selection device related to a sixth embodiment of the present invention.

A sixth example of a selection device related to one embodiment of the present invention is shown in FIG. 13. A first selection signal Dn (1501) and a plurality of second selection signals Fn (1503) from a conversion table circuit (1502) are provided, and the second selection signals Fn (1503) are input to a selection device (1504). 3 value selection signals Sn (1505) from a selection circuit operate the selection circuit by calculating the usage frequency of a unit cell by a selection signal with at least 2 or more integration circuits (1510a, 1510b) configured with a delay element and an adder. The conversion table circuit (1502) is input with a control signal (1521) from a sequential control circuit (1520) and an internal state value (1521) of the integration circuits is input to the sequential control circuit (1520)

In this way, it is possible to adaptively control the operation of the sequential control circuit according to the internal state of the selection device by inputting an internal state value of the integration circuits to the sequential control circuit. That is, in the case where the internal state of an integration circuit which controls the selection device becomes unstable (the length of time for smoothing an error becomes longer) it is possible to adaptively operate the MAP circuit (1502) and stably operate the selection device. In this way, it is possible to optimize the relationship between the length of time for smoothing an error and power consumption.

Figure 14:
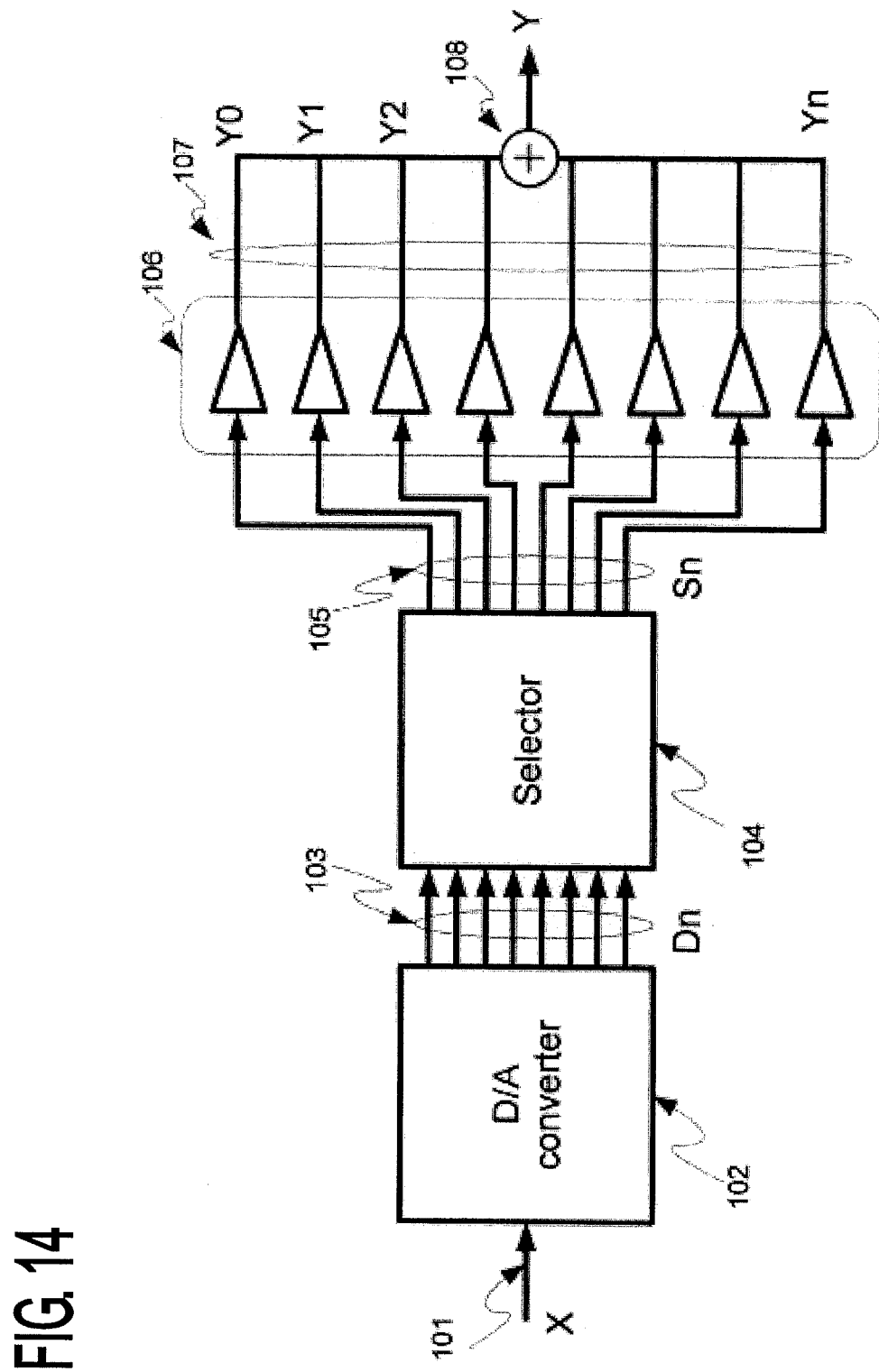
FIG. 14 is a schematic of a D/A converter which uses a 2 value selection signal related to one embodiment of the present invention.

FIG. 14 concisely explains the operation of an error diffusion circuit which is used in a selection device related to another embodiment of the present invention. A D/A converter which performs error diffusion is comprised of a digital signal X (101), a D/A converter (102), a plurality of digital signals Dn (103) from the D/A converter, a selection device (104), a selection signal Sn (105) from the selection device, a plurality of unit cells (106), a plurality of outputs Yn (107) from the unit cells, and an adder (108) which adds the Yn.

In Table 4, a truth table of the digital selection signal Dn (103) from the D/A converter is shown (left side), and a truth table of the output signal Yn (107) of unit cells is shown (right side). As is shown in table 4, the output of the D/A converter is a thermometer code. Furthermore, the unit cell is weighted as in table 5 with respect to a 2 value selection signal.

TABLE 4

Truth table of D/A output signal (Dn)

| X  | D0 | D1 | D2 | D3 | D4 | D5 | D6 | D7 |
|----|----|----|----|----|----|----|----|----|
| +4 | 1  | 1  | 1  | 1  | 1  | 1  | 1  | 1  |
| +3 | 1  | 1  | 1  | 1  | 1  | 1  | 1  | 0  |
| +2 | 1  | 1  | 1  | 1  | 1  | 1  | 0  | 0  |
| +1 | 1  | 1  | 1  | 1  | 1  | 0  | 0  | 0  |
| 0  | 1  | 1  | 1  | 1  | 0  | 0  | 0  | 0  |
| −1 | 1  | 1  | 1  | 0  | 0  | 0  | 0  | 0  |
| −2 | 1  | 1  | 0  | 0  | 0  | 0  | 0  | 0  |
| −3 | 1  | 0  | 0  | 0  | 0  | 0  | 0  | 0  |
| −4 | 0  | 0  | 0  | 0  | 0  | 0  | 0  | 0  |

Truth table of cell selection(Yn)

| Y0 | Y1 | Y2 | Y3 | Y4 | Y5 | Y6 | Y7 | Y |
|----|----|----|----|----|----|----|----|---|
| 0.5 | 0.5 | 0.5 | 0.5 | 0.5 | 0.5 | 0.5 | 0.5 | +4 |
| 0.5 | 0.5 | 0.5 | 0.5 | 0.5 | 0.5 | 0.5 | −0.5 | +3 |
| 0.5 | 0.5 | 0.5 | 0.5 | 0.5 | 0.5 | −0.5 | −0.5 | +2 |
| 0.5 | 0.5 | 0.5 | 0.5 | 0.5 | −0.5 | −0.5 | −0.5 | +1 |
| 0.5 | 0.5 | 0.5 | 0.5 | −0.5 | −0.5 | −0.5 | −0.5 | 0 |
| 0.5 | 0.5 | 0.5 | −0.5 | −0.5 | −0.5 | −0.5 | −0.5 | −1 |
| 0.5 | 0.5 | −0.5 | −0.5 | −0.5 | −0.5 | −0.5 | −0.5 | −2 |

TABLE 4-continued

| 0.5 | −0.5 | −0.5 | −0.5 | −0.5 | −0.5 | −0.5 | −0.5 | −3 |
|---|---|---|---|---|---|---|---|---|
| −0.5 | −0.5 | −0.5 | −0.5 | −0.5 | −0.5 | −0.5 | −0.5 | −4 |

TABLE 5

| Sn | Yn |
|---|---|
| 0 | +0.5 |
| 1 | −0.5 |

As is shown in FIG. 14 and table 4, in the case where there are 8 unit cells (n=8), it is possible for the output Y to take the values −4, −3, −2, −1, 0, 1, 2, 3, 4 (n+1=9). For example, in the case where 0 is to be output, when 4 unit cells among the 8 unit cells are instructed to output +0.5, and the remaining 4 unit cells are instructed to output −0.5, −2 and +2 are cancelled out by the adder and it is possible to output 0.

Figure 15:
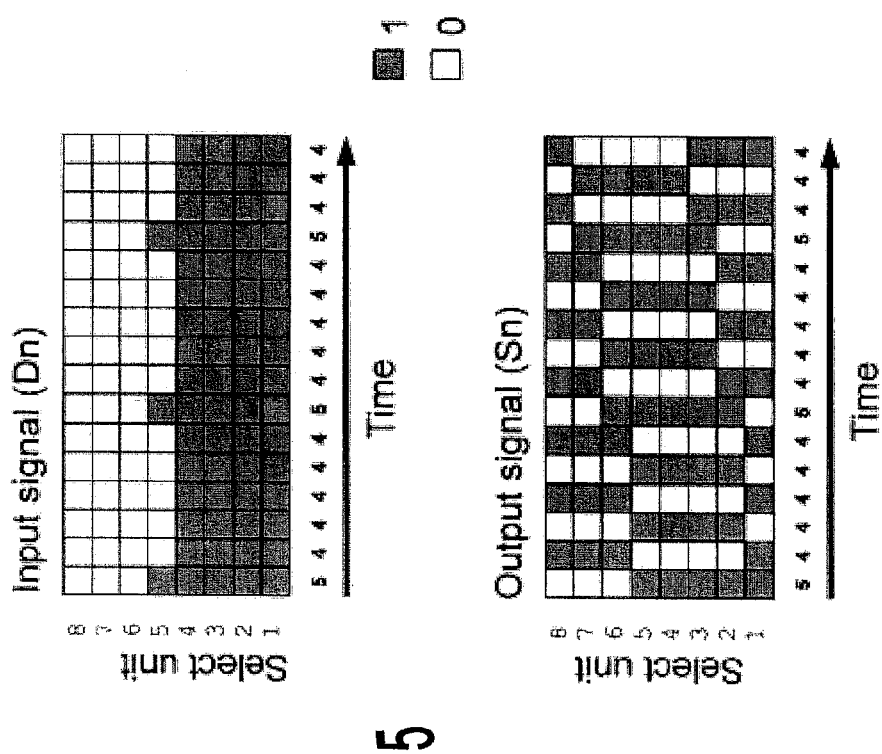
FIGS. 15(a) and (b) are diagrams for explaining the operation principles of a selection device used in a D/A converter which uses a 2 value selection signal related to one embodiment of the present invention.

FIGS. 15(*a*) and (*b*) compare the case where an error diffusion selection device is used and the case where it is not used, in a time direction of a selection of unit cells Yn. In the example of FIGS. 15(*a*) and (*b*), a D/A converter outputs a signal close to 0, that is, a selection signal which selects 4 or 5 among 8 in turn. As is shown in the diagram, a selection signal from the selection device outputs a selection signal so that 4 or 5 unit cells are selected in turns among 8 similarly. Both are signals which select the same number of unit cells, however, while the selection signal from the D/A converter always selects the same unit cells, the unit cells selected by the selection signal from the selection device change with time. In FIG. 15(*b*), because an algorithm which selects cells which have not been selected in order, first, in the time period after (000111111) the same as the input is selected, (11100001) is selected, and in the next time period, the selected cell such as (00011110) changes, and because all the unit cells are used equally during a short time period, errors are smoothed.

The operation of an example of a unit cell weighted with (−0.5, +0.5) with respect to a 2 value selection signal was explained above, however, the same effects can also be obtained in the case where other weightings are used. For example, because it is possible to take the values Y=0, 1, 2, 3, 4, 5, 6, 7, 8 (n+1=9) in the case where a weighting of (0, 1) is used, for example, in the case where 4 is output, when 4 unit cells are selected with 1 among 8 unit cells, and the remaining 4 unit cells are selected with 0, it is possible to use error diffusion technology by sequentially changing a method which selects 4 unit cells among 8 unit cells every time 4 is output the same as in the case where 4 can be output (−0.5, +0.5).

Figure 16:
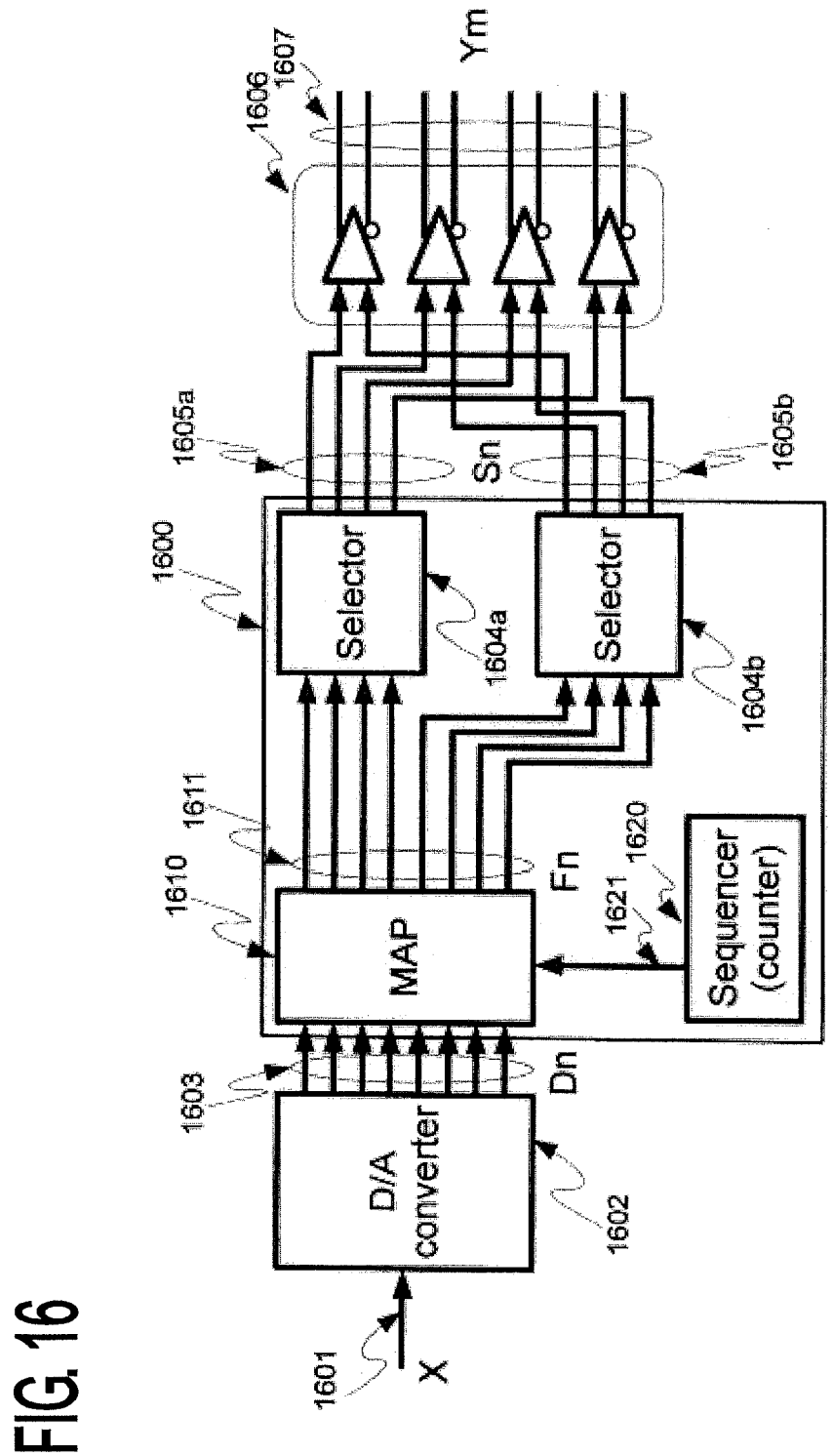
FIG. 16 is a structural diagram of a selection device related to a seventh embodiment of the present invention.

A seventh example of a selection device related to one embodiment of the present invention is shown in FIG. 16. First digital selection signals Dn (1603) and a plurality of second digital selection signals Fn (1611) from a conversion table circuit (1610) are provided. The plurality of second digital selection signals Fn (1611) are input to a plus side selection circuit (1604*a*) and a minus side selection circuit (1604*b*). Here, "a plus side selection circuit" means a circuit which selects a unit cell which is instructed to perform an output of a plus side value. For example, the plus side selection circuit (1604*a*) outputs 0 or 1 as a selection signal. Similarly "a minus side selection circuit" means a circuit which selects a unit cell which is instructed to perform an output of a minus side value. For example, the minus side selection circuit (1604*a*) outputs 0 or −1 as a selection signal.

In addition, a second digital selection signal which is input to a plus side selection circuit is referred to as "a plus side second digital selection signal" and a second digital selection signal which is input to a minus side selection circuit is referred to as "a minus side second digital selection signal." In addition, a signal output by a plus side selection circuit is referred to as "a plus side selection signal" and a signal output by a minus side selection circuit is referred to as "a minus side selection signal."

Furthermore, in the explanation below, a truth table (data which determines the relationship between a digital signal X (1610) and the second digital selection signal (1611)) used by a conversion table circuit (1610) is not limited to being used in the first example to the sixth example. It is possible to use an arbitrary truth table.

3 value selection signals Sn (1605*a*, 1605*b*) which are output as a whole by the two selection circuits (1604*a*, 1604*b*) are output by calculating the frequency of the selection of the unit cell by the selection signals. At this time, each of the plus side selection device (1604*a*) and the minus side selection device (1604*b*) operate so that unit cells are selected in order from the smallest frequency of selection. In addition, a control signal (1621) is input to the conversion table circuit (1602) from the sequential control circuit (1620).

In this way, by inputting the plus side and minus side of a second digital selection signal Fn to separate selection circuits, it is possible to independently stabilize an operation for smoothing errors in the case where a plus side cell is selected and an operation for smoothing errors in the case where a minus side cell is selected. By this operation, it is possible to optimize the length of time for smoothing errors and power consumption.

Figure 17:
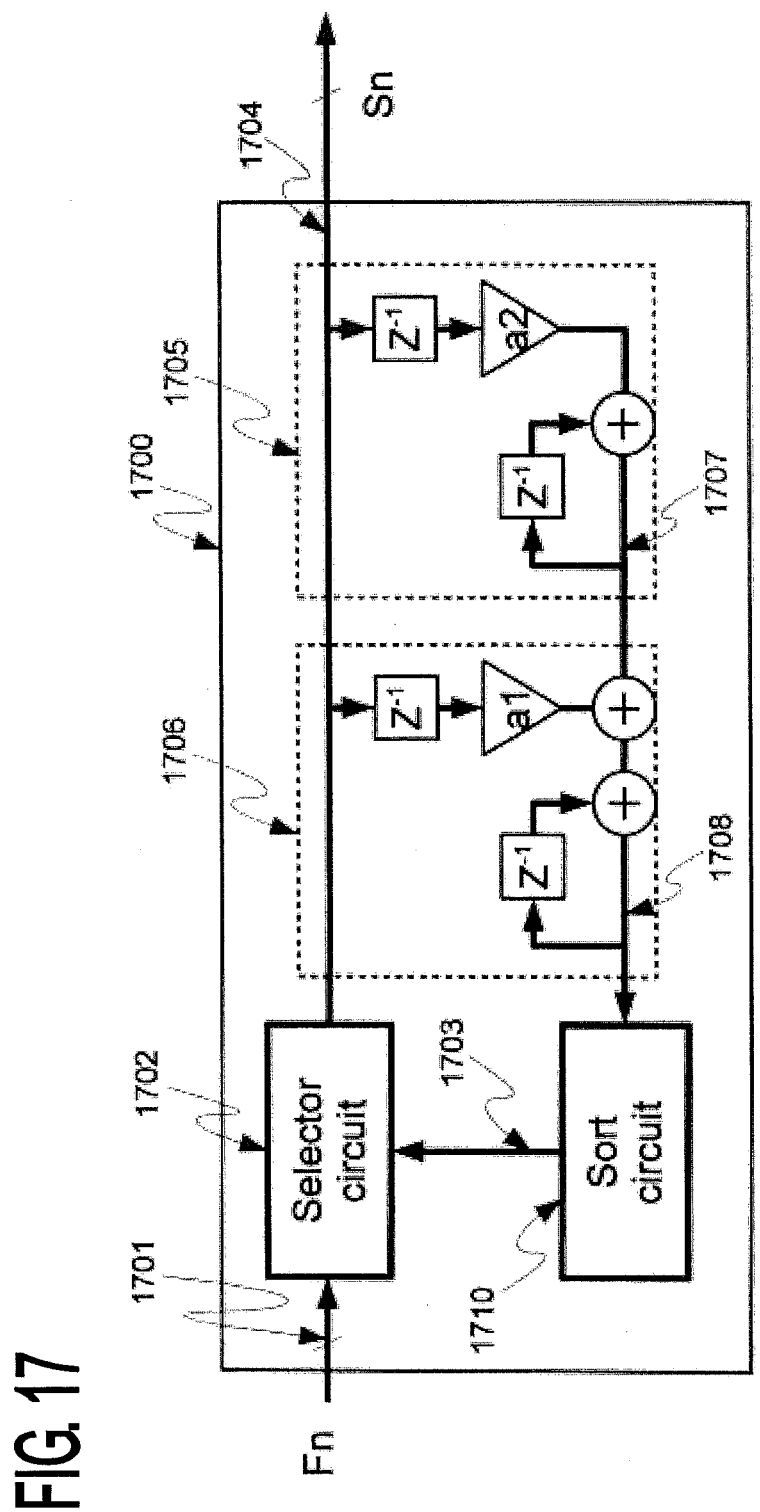
FIG. 17 is a structural diagram of a selection device of a selection device related to one embodiment of the present invention.

An example of a selection circuit (1700) used in one embodiment of the present invention is shown in FIG. 17. A plurality of second digital selection signals Fn (1701) from a conversion table circuit is provided and the second digital selection signal Fn is input to a selection circuit (1702). 3 value selection signals Sn (1705) output by the selection circuit is input to a circuit having at least two or more integration circuits configured with a delay element and an adder. An output signal (1707) from a first integration circuit (1705) is input to a second integration circuit (1706) and the selection signal Sn (1705) is accumulated. The usage frequency of a unit cell is represented by the result of this accumulation. By inputting an output signal (1708) from the second integration circuit (1706) to a sort circuit (1710) a signal which selects unit cells in order from the smallest selection frequency is generated and the selection circuit is controlled.

Figure 18:
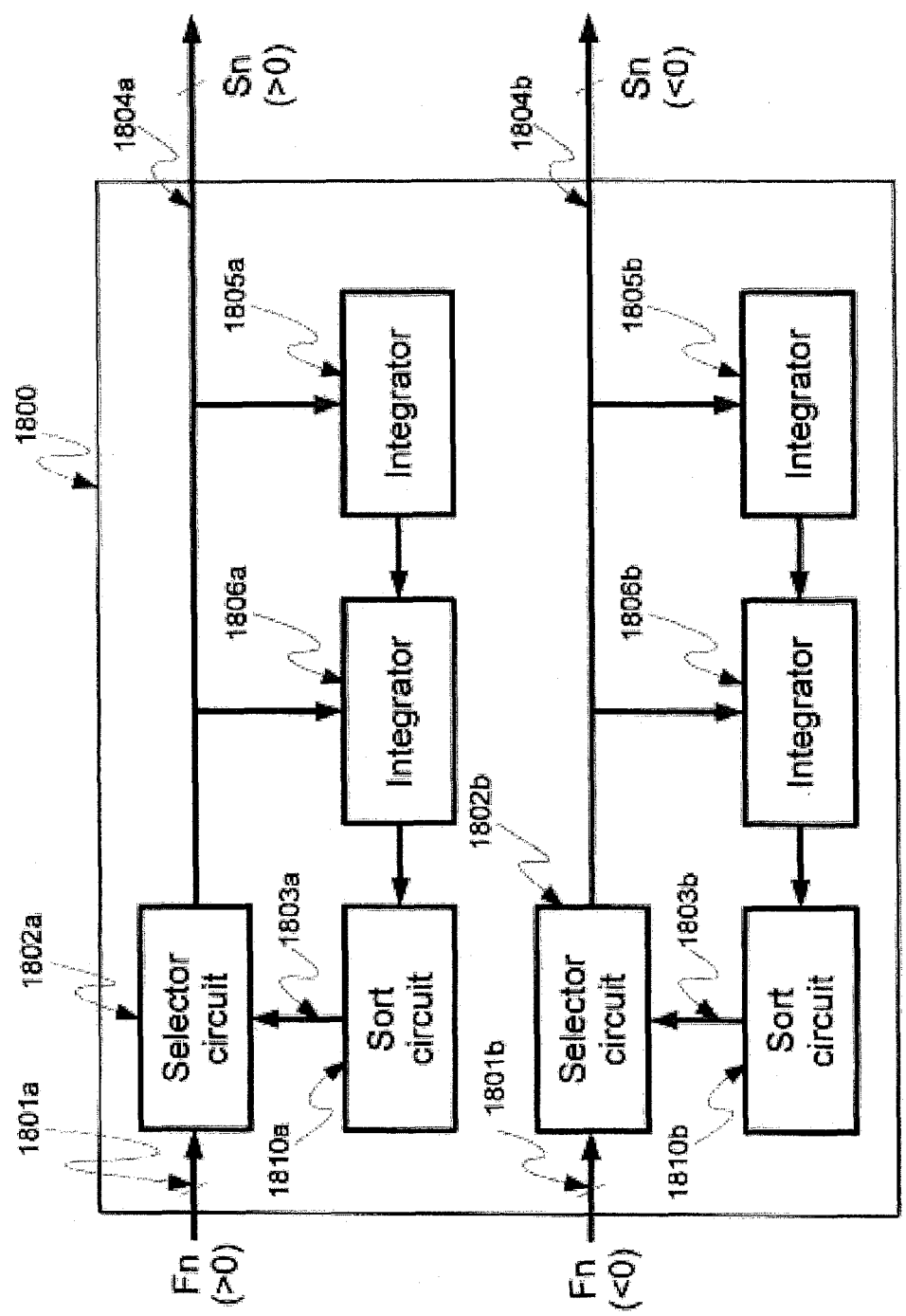
FIG. 18 is a structural diagram of a selection circuit of a selection device related to one embodiment of the present invention.

Another example of a selection circuit (1800) which is used in one embodiment of the present invention is shown in FIG. 18. A plurality of second digital selection signals Fn from a conversion table circuit is divided into the plus side (1801*a*) and the minus side (1801*b*). The plus side second digital selection signals (1801*a*) are input to a selection circuit (1802*a*) and selection signals Sn (1804*a*) are output. The selection signals Sn are sequentially input to at least two or more integration circuits (1805*a*, 1806*a*) configured with a delay circuit and an adder, and the output of the integration circuit (1806*a*) is input to a sort circuit (1810*a*). The sort circuit (1810*a*) generates a signal (1803*a*) which selects a unit cell which outputs a plus side value in order from the smallest selection frequency and the selection circuit (1802*a*) is controlled. In addition, the minus side second digital selection signals (1801*b*) are input to a selection circuit (1802*b*) and selection signals Sn (1804*b*) are output. The selection signals Sn are sequentially input to at least two or more integration circuits (1805*b*, 1806*b*) configured with a delay circuit and an adder, and the output of the integration circuit (1806*b*) is input to a sort circuit (1810*b*). The sort circuit (1810*b*) generates a signal (1803*b*) which selects a unit cell which outputs a minus side value in order from the smallest selection frequency and the selection circuit is controlled. By inputting a plus side second digital selection signal and minus side second digital selection signal to separate selection circuits it becomes possible to independently stabilize an operation for smoothing errors in the case where a unit cell which outputs a plus value is selected and an operation for smoothing errors in the case where a unit cell which outputs a minus value is selected, and it is also possible to optimize the relationship between the length of time for smoothing errors and power consumption.

Figure 19:
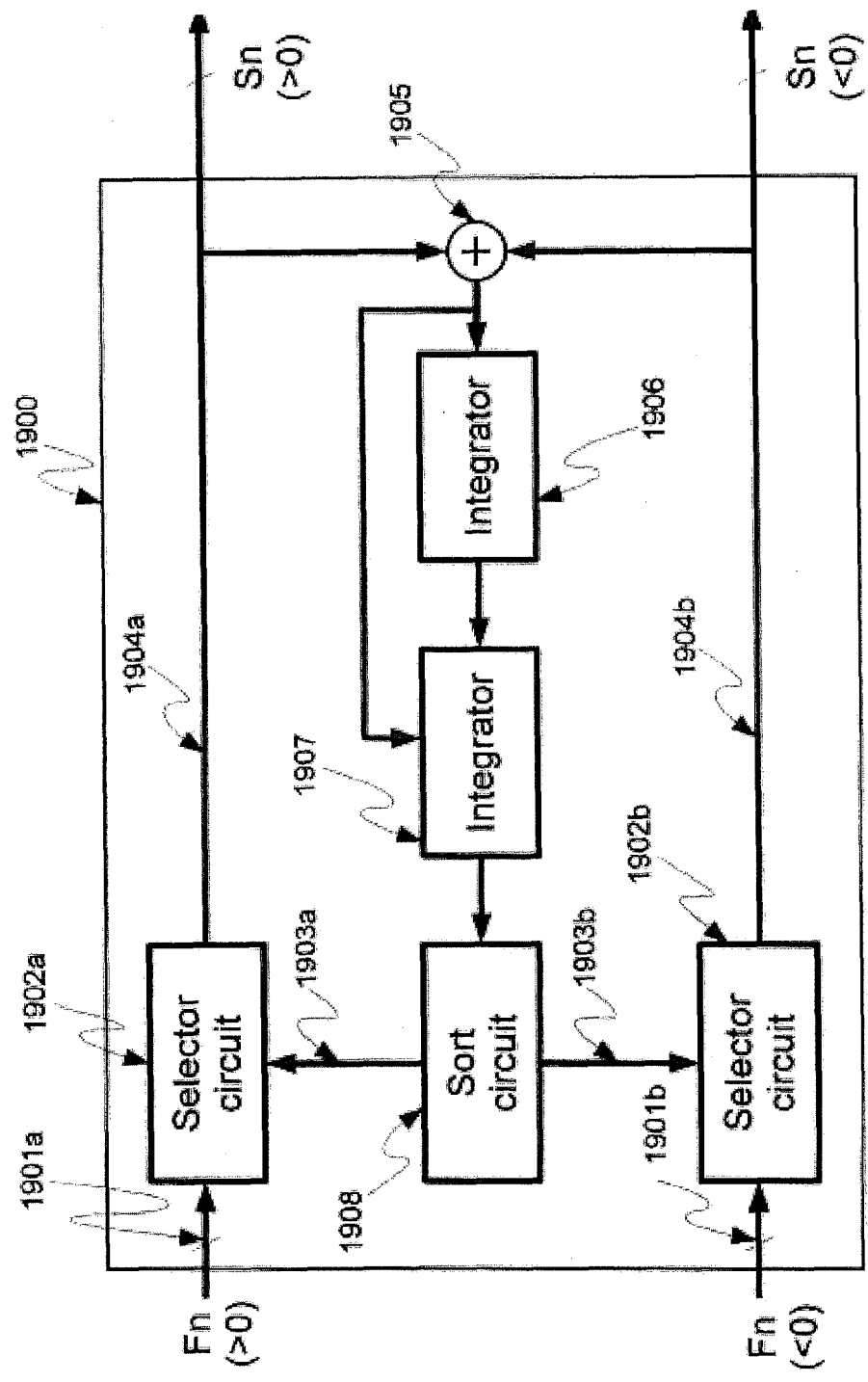
FIG. 19 is a structural diagram of a selection circuit of a selection device related to one embodiment of the present invention.

Another example of a selection circuit (1900) used in one embodiment of the present invention is shown in FIG. 19. A plurality of second digital selection signals Fn from a conversion table circuit are divided into a plus side second selection signal (1901*a*) and a minus side selection signal (1901*b*). The plus side second digital selection signal (1901*a*) is input to a selection circuit (1902*a*) and selection signals Sn (1905*a*) are output. The minus side second digital selection signal (1901*b*) is input to a selection circuit (1902*b*) and selection signals Sn (1905*b*) are output. After the selection signals Sn output by the plus side selection circuit (1902*a*) and the minus side selection circuit (1902*b*) are added by an adder (1905), the selection signals Sn are sequentially input to at least two or more integration circuits (1906, 1907) configured with a delay circuit and an adder. The output of the integration circuit (1907) is input to a sort circuit (1908). The sort circuit (1908) generates a signal (1903*b*) which selects a plus side unit cell and a signal which selects a minus side unit cell in order from the smallest selection frequency, and each selection circuit is controlled. In the present invention, it is possible to reduce the number of necessary integration circuits by adding signals from a plus side selection circuit and signals from a minus side selection circuit using an adder. In addition, because there are separate selection circuits it becomes possible to independently stabilize an operation for smoothing errors in the case where a plus side unit cell is selected and an operation for smoothing errors in the case where a minus side unit cell is selected, and it is also possible to optimize the relationship between the length of time for smoothing errors and power consumption.

Figure 20:
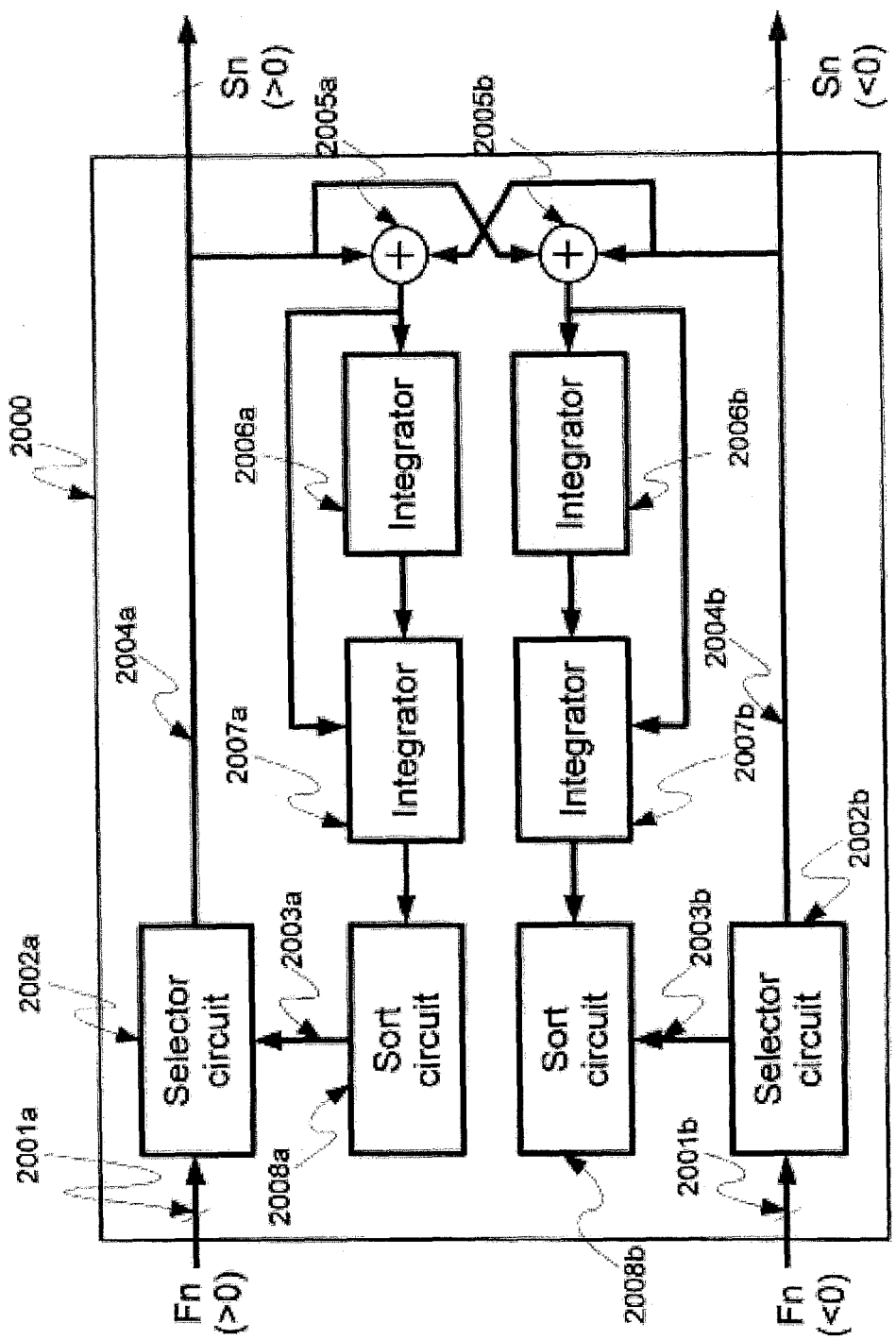
FIG. 20 is a structural diagram of a selection circuit of a selection device related to one embodiment of the present invention.

Another example of a selection circuit (2000) used in one embodiment of the present invention is shown in FIG. 20. A plurality of second digital selection signals Fn from a conversion table circuit are divided into a plus side digital selection signal (2001*a*) and a minus side digital selection signal (2001*b*), which are input into each selection circuit. The plus side second digital selection signal (2001*a*) is input to a selection circuit (2002*a*) and selection signals Sn (2005*a*) are output. The minus side second digital selection signal (2001*b*) is input to a selection circuit (2002*b*) and selection signals Sn (2005*b*) are output. After the plus side and minus side selection signals Sn are added by an adder (2005*a*) they are sequentially input to at least two or more integration circuits (2006*a*, 2007*a*) configured with a delay element and an adder. The output of the integration circuit (2007*a*) is input to a sort circuit (2008*a*). The sort circuit (2008*a*) generates a signal (2003*a*) which selects a plus side unit cell in order from the smallest selection frequency and the selection circuit (2002*a*) is controlled. Similarly, after the plus side and minus side selection signals Sn are added by the adder (2005*b*) they are sequentially input to at least two or more integration circuits (2006*b*, 2007*b*) configured with a delay element and an adder. The output of the integration circuit (2007*b*) is input to a sort circuit (2008*b*). The sort circuit (2008*b*) produces a signal (2003*b*) which selects a minus side unit cell in order from the smallest selection frequency and the selection circuit (2002*b*) is controlled. An addition coefficient is independently selected when the signals from the plus side and minus side selection circuits are added by an adder and by weighting and adding using the addition coefficient it is possible to optimize an error diffusion operation. In addition, because there are separate selection circuits it becomes possible to independently stabilize an operation for smoothing errors in the case where a plus side unit cell is selected and an operation for smoothing errors in the case where a minus side unit cell is selected, and it is also possible to optimize the relationship between the length of time for smoothing errors and power consumption.

In one embodiment of the present invention, a signal which selects unit cells in order from the smallest selection frequency is generated using a sort circuit and a selection circuit is controlled as in the examples stated above. However, an embodiment of the present invention is not limited to using a sort circuit. A logic circuit following arbitrary algorithms may be used instead of a sort circuit.

Figure 21:
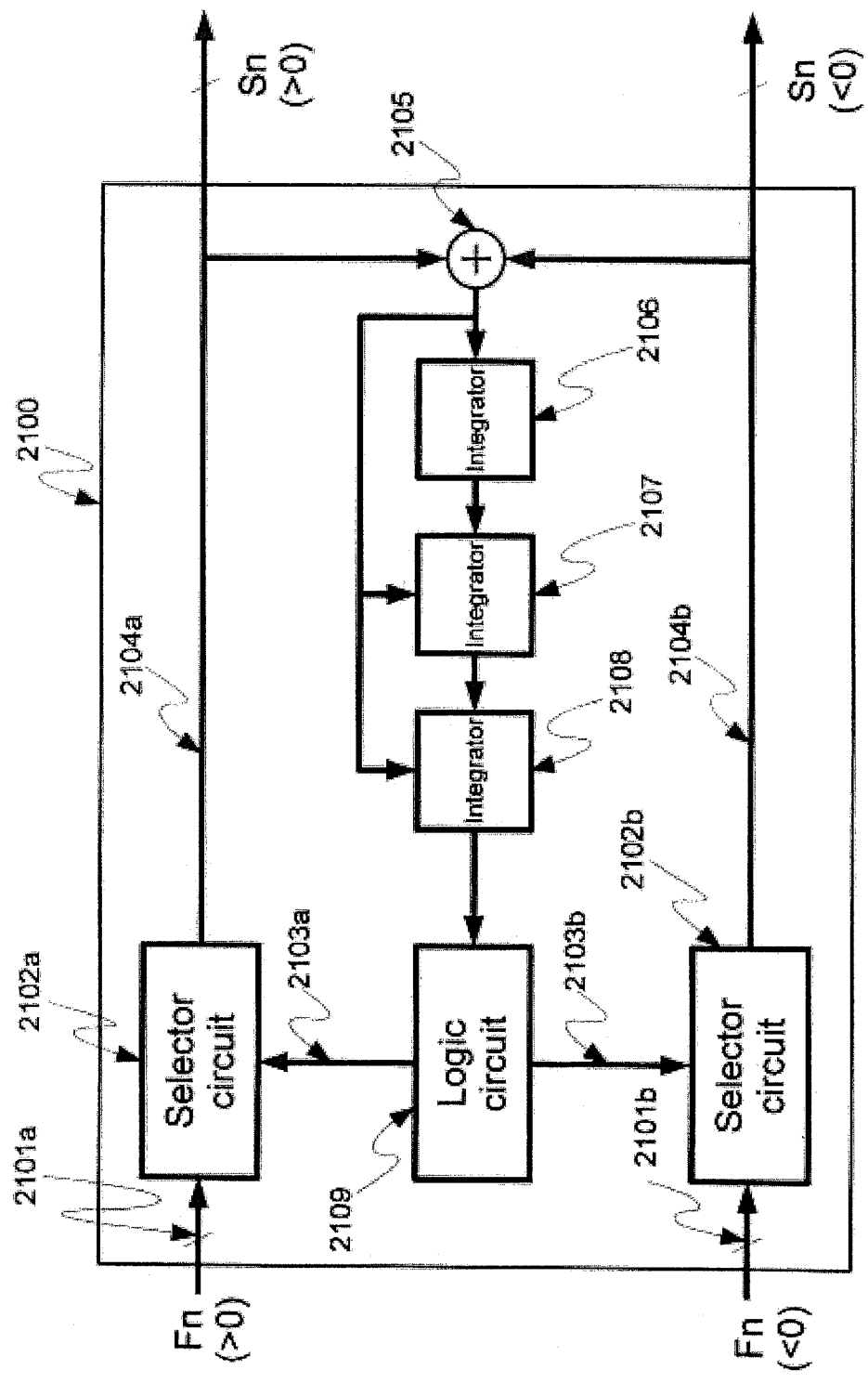
FIG. 21 is a structural diagram of a selection circuit of a selection device related to one embodiment of the present invention.

Another example of a selection circuit (2100) used in one embodiment of the present invention is shown in FIG. 21. A plurality of second digital selection signals Fn from a conversion table circuit are divided into a plus side second digital selection signal (2101*a*) and a minus side second digital selection signal (2101*b*), the plus side second digital selection signal (2101*a*) is input to a selection circuit (2102*a*) and a selection signal (2105*a*) is output. The minus side second digital selection signal (2101*b*) is input to a selection circuit (2102*b*) and a selection signal Sn (2105*b*) is output. After the plus side and minus side selection signals Sn are added by an adder (2105) they are sequentially input to at least three (2106, 2107, 2108) or more integration circuits configured with a delay element and an adder. The output of the integration circuit (2108) is input to a logic circuit (2103*a*) and a signal (2103*a*) which selects a plus side unit cell and a signal (2103*b*) which selects a minus side unit cell according to an algorithm of the logic circuit are produced. Each selection circuit is controlled respectively by the signal (2103*a*) and the signal (2103*b*). In the present example, the selection data is filter calculated using at least three or more integration circuits. Because it is possible to obtain stable error diffusion effects regardless of the number of selections of an element per time period by using three or more integration circuits, it is possible to apply the present invention to a digital speaker device which uses a multi-unit.

In the explanation above, a selection device is disclosed which includes an acquisition part (for example, the conversion table circuit (710)) which acquires a digital selection signal, and an output part (for example, the selection circuit (704)) which outputs a selection signal to each of a plurality of unit cells which can be instructed to output a value 0, wherein a digital selection signal is a signal which instructs the output of a value which corresponds to a selection signal to a unit cell, the total of the values of selection signals which are output to a plurality of unit cells is a value which is determined according to a digital selection signal, and if an output corresponding to a digital selection signal is 0, a unit cell which is output with a selection signal which instructs the output of a value Ns which are not 0 exist. Here, a selection signal may be a multi-value signal such as a 3 value signal (1, 0, −1) or a 5 value signal (2, 1, 0, −1, −2).

In addition, in the case of supposing that there are no errors in the outputs of unit cells, it is possible to obtain a value 0 as a result of the addition (it is also possible to include measuring average time in "addition") of the total value of outputs of unit cells which are output with selection signals which instruct an output of a plus value and the total value of outputs of unit cells which is output with selection signals which instruct an output of a minus value.

In addition, if the output corresponding to a digital selection signal is not a value 0, a unit cell which is output with a selection signal which instructs an output of a plus signal and a unit cell which is output with a selection signal which instructs an output of a minus signal exist, and the total value of outputs of unit cells which are output with selection signals which instruct outputs of plus values and the total value of outputs of unit cells which are output with selection signals which instructs outputs of minus values can become a value of an output corresponding to a digital selection signal.

In addition, a selection device is disclosed having an acquisition part (for example, the conversion table circuit (1610)) which acquires a digital selection signal, and an output part (for example, the selection circuits (1604a, 1604b)) which output a selection signal to a plurality of unit cells, wherein the output part includes a first selection circuit (for example, the selection circuit (1604a)) which outputs a plus value, and a second selection circuit (for example, the selection circuit (1604b)) which outputs a minus value.

In addition, this selection device may also include a first integration part (for example, the integration circuit (1805a, 1806a) which accumulates selection signals which are output by the first selection circuit, and a second integration part (for example, the integration circuits (1805b, 1806b) which accumulates selection signals which are output by the second selection circuit. In this case, the first selection circuit can select unit cells in order from the smallest selection frequency which represents the results of the accumulation by the first integration part and the second selection circuit can select unit cells in order from the smallest selection frequency which represents the results of the accumulation by the second integration part.

In addition, the first integration part may accumulate with an addition coefficient the sum of weighting a selection signal which is output by the first selection circuit and a selection signal which is output by the second selection circuit. In addition, the second integration part may accumulate using an addition coefficient the sum of weighting a selection signal which is output by the second selection circuit and a selection signal which is output by the first selection circuit. At this time, it is not necessary that the addition coefficient used by the first integration part and the addition coefficient used by the second integration be the same.

In addition, the selection device does not need to be arranged with two integration parts. One integration part (third integration part) may be arranged. In this case, the third integration part accumulates the sum of a selection signal which is output by the first selection circuit and a selection signal which is output by the second selection circuit. Also, each of the first selection circuit and the second selection circuit selects unit cells in order from the smallest selection frequency which represents the result of accumulation by the third integration part.

Furthermore, the first integration part, second integration part and third integration part can be arranged with one, two or three integration circuits. In the case where two or more integration circuits are arranged, it is possible to connect the integration circuits in series as shown in FIG. 17 and FIG. 21.

What is claimed is:

1. A selection device comprising:
   an acquisition part which acquires a digital selection signal; and
   an output part which outputs a selection signal to each of a plurality of unit cells which can be instructed to output a value 0, outputs of the plurality of unit cells being input to an adder, the adder outputting a value of a sum of the outputs of the plurality of unit cells, wherein
   the selection signal instructs an output of a value corresponding to the selection signal to the unit cell,
   the value output by the adder is a value determined according to the digital selection signal,
   when the value output by the adder corresponding to the digital selection signal is a value 0, a unit cell exists which is output with a selection signal which instructs an output of a value N which is not 0,
   a time average of the value output by the adder is a value 0 when the digital selection signal is a value 0, and
   wherein the digital selection signal is a digital audio signal, each of the unit cells is a drive circuit which drives a voice coil, and the selection signal represents an existence and a polarity of a current which flows in the voice coil which is driven by the unit cell.

2. The selection device according to claim 1, wherein when the value output by the adder which corresponds to the digital selection signal is a value 0, the number of unit cells output with selection signals which instruct outputs of value N which is not a value 0 becomes the same as the number of unit cells which are output with selection signals which instruct outputs of value −N.

3. The selection device according to claim 1, wherein the output part includes a conversion part which outputs the number of unit cells which are instructed to perform outputs of values other than 0 according to the digital selection signal, and a selection part which outputs selection signals according to the number of unit cells which are output by the conversion part, wherein when the output corresponding to the digital selection signal is a value 0, the number of unit cells output by the conversion part is 2 or more.

4. The selection device according to claim 3, wherein the conversion part selects from the number of two or more types of unit cells according to a digital selection signal corresponding to a value 0.

5. The selection device according to claim 3, wherein the selection part measures the frequency of selection of the unit cell by the selection signal and determines, in order of smallest frequency of selection, a unit cell which is outputs with a selection signal which instructs an output of a value N which is not 0.

6. The selection device according to claim 1, wherein the selection part instructs an output of a value of either 1, 0, or −1 to the unit cells.

7. The selection device according to claim 1, wherein the output part includes a first selection circuit which outputs a selection signal of a unit cell which outputs a plus value and a second selection circuit which outputs a selection signal of a unit cell which outputs a minus value.

8. The selection device according to claim 7, further comprising:
   a first integration part which accumulates a selection signal output by the first selection circuit, and
   a second integration part which accumulates a selection signal output by the second selection circuit,
   wherein
   the first selection circuit selects unit cells in order from the smallest selection frequency which indicates the results of accumulation by the first integration part, and the second selection circuit selects unit cells in order from the smallest selection frequency which indicates the results of accumulation by the second integration part.

9. The selection device according to claim 8, wherein the first integration part and the second integration part each accumulates the sum of weighting a selection signal which is output by the first selection circuit and a selection signal which is output by the second selection circuit.

10. The selection device according to claim 7, further comprising:
   a third integration part which accumulates the sum of a selection signal which is output by the first selection circuit and a selection signal which is output by the second selection circuit, the first selection circuit and the second selection circuit selecting unit cells in order from the smallest selection frequency which indicates the results of accumulation by the third integration part.

11. The selection device according to claim 10, wherein the third integration circuit includes three or more integration circuits.

* * * * *